US008972835B1

(12) United States Patent
Rahul et al.

(10) Patent No.: US 8,972,835 B1
(45) Date of Patent: *Mar. 3, 2015

(54) ENCODING AND DECODING OF INFORMATION USING A BLOCK CODE MATRIX

(75) Inventors: Kumar Rahul, Hyderabad (IN); Santosh Yachareni, San Diego, CA (US)

(73) Assignee: Xilinx, Inc., San Jose, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 13/490,322

(22) Filed: Jun. 6, 2012

(51) Int. Cl.
G06F 11/00 (2006.01)

(52) U.S. Cl.
USPC .......................................... 714/800

(58) Field of Classification Search
CPC ... H03M 13/091; H04L 1/0061; H04L 1/0083
USPC ......... 714/785, 800, 795, 777, 782, 784, 746, 714/752, 776; 375/262, 341; 342/373
See application file for complete search history.

(56) References Cited

U.S. PATENT DOCUMENTS

| | | | |
|---|---|---|---|
| 3,644,902 A | 2/1972 | Beausoleil | |
| 3,688,265 A * | 8/1972 | Carter et al. | 714/763 |
| 3,697,949 A * | 10/1972 | Carter et al. | 714/763 |
| 4,547,882 A | 10/1985 | Tanner | |
| 4,736,376 A * | 4/1988 | Stiffler | 714/785 |
| 5,220,568 A * | 6/1993 | Howe et al. | 714/782 |
| 5,381,425 A * | 1/1995 | Bitzer et al. | 714/793 |
| 5,490,155 A | 2/1996 | Abdoo et al. | |
| 5,828,676 A * | 10/1998 | Hurlbut et al. | 714/752 |
| 5,938,773 A * | 8/1999 | Hauck et al. | 714/6.24 |
| 6,429,682 B1 | 8/2002 | Schultz et al. | |
| 6,604,222 B1 * | 8/2003 | Jensen | 714/785 |
| 6,823,470 B2 * | 11/2004 | Smith et al. | 714/4.5 |
| 7,254,800 B1 | 8/2007 | Trimberger | |
| 7,426,678 B1 | 9/2008 | Cory et al. | |
| 7,539,926 B1 | 5/2009 | Lesea | |
| 7,620,873 B2 * | 11/2009 | Kanaoka et al. | 714/752 |
| 8,122,317 B1 | 2/2012 | Clark et al. | |
| 8,359,515 B2 * | 1/2013 | Gunnam | 714/752 |
| 8,806,295 B2 * | 8/2014 | Jagmohan et al. | 714/763 |
| 2006/0156177 A1 | 7/2006 | Kottapalli et al. | |
| 2011/0161773 A1 * | 6/2011 | Martwick et al. | 714/755 |
| 2011/0239082 A1 | 9/2011 | Yang | |

OTHER PUBLICATIONS

U.S. Appl. No. 13/078,172, filed Apr. 1, 2011, Lesea et al.
U.S. Appl. No. 13/490,269, filed Jun. 6, 2012, Rahul et al.
Chapman, Ken et al., *SEU Strategies for Virtex-5 Devices*, XAPP864 (v1.0.1), Mar. 5, 2009, pp. 1-29, Xilinx, Inc., San Jose, CA, USA.
Chapman, Ken, *SEU Strategies for Virtex-5 Devices*, XAPP864 (v2.0), Apr. 1, 2010, pp. 1-16, Xilinx, Inc., San Jose, CA, USA.
Carmichael, Carl et al., *Correcting Single-Event Upsets Through Virtex Partial Configuration*, XAPP216 (v1.0), Jun. 1, 2000, pp. 1-12, Xilinx, Inc., San Jose, CA, USA.

(Continued)

*Primary Examiner* — Phung M Chung
(74) *Attorney, Agent, or Firm* — W. Eric Webostad

(57) ABSTRACT

An encoder block to receive input data has a KR-Matrix block. The KR-Matrix block is configured to: exclusively OR combinations of subsets of data bits of the input data to generate (n−1) parity bits for n a positive integer greater than zero; and exclusively OR a combination of all of the data bits and all the (n−1) parity bits to generate an (n) parity bit.

14 Claims, 17 Drawing Sheets

(56) References Cited

OTHER PUBLICATIONS

Dutta, Avijit et al., "Multiple Bit Upset Tolerant Memory Using a Selective Cycle Avoidance Based SEC-DED-DAEC Code," *Proc. of the 25th IEEE VLSI Test Symposium*, May 6, 2007, pp. 349-354, IEEE, Piscataway, New Jersey, USA.

Lim, David et al., *Two Flows for Partial Reconfiguration: Module Based or Small Bit Manipulations*, XAPP290 (v1.0), May 17, 2002, pp. 1-23, Xilinx, Inc., San Jose, CA, USA.

ETO, EMI, *Difference-Based Partial Reconfiguration*, XAPP290 (v2.0), Dec. 3, 2007, pp. 1-11, Xilinx, Inc., San Jose, CA, USA.

Tam, Simon, *Single Error Correction and Double Error Detection*, XAPP645 (v2.2), Aug. 9, 2006, pp. 1-12, Xilinx, Inc., San Jose, CA, USA.

Xilinx, Inc., *LogiCORE IP Soft Error Mitigation Controller v1.2*, DS796, Dec. 14, 2010, pp. 1-14, Xilinx, Inc., San Jose, CA, USA.

Xilinx, Inc., *Virtex-6 FPGA Configuration User Guide*, UG360 (v3.2), Nov. 1, 2010, pp. 1-180, Xilinx, Inc., San Jose, CA, USA.

\* cited by examiner

FIG. 3

| | | | | | | | |
|---|---|---|---|---|---|---|---|
| | | a1[15] | | | b0[15] | | |
| | | | b1[12] | b1[5] | b1[2] | | P7 |
| | | | b1[11] | | | | |
| b1[14] | | b1[7] | b1[9] | | b1[15] | a1[9] | a1[12] |
| | | b1[13] | b1[6] | | b1[8] | | |
| | a1[11] | a1[8] | b1[4] | b0[14] | b1[1] | a1[13] | a1[3] |
| b1[10] | a1[14] | a1[1] | | | a1[10] | b0[4] | P6 |
| | a1[7] | b1[3] | | b0[6] | b0[11] | b1[0] | |
| | a1[6] | | b0[9] | b0[1] | b0[13] | b0[7] | |
| | a1[2] | a1[5] | | b0[2] | a1[0] | b0[8] | b0[12] |
| b0[3] | | b0[5] | P2 | | a0[13] | a0[10] | P5 |
| | b0[0] | a0[14] | | a0[8] | a0[5] | a0[2] | P4 |
| a0[12] | a0[9] | a0[6] | | a0[4] | a0[1] | a0[11] | P3 |
| a0[7] | a0[3] | a0[0] | | | P1 | P0 | |

SYND[0]= a0[11] ^ a0[2] ^ a0[10] ^ b0[8] ^ b0[7] ^ b1[0] ^ b0[4] ^ a1[13] ^ a1[9] ^ ← 500
a1[4] ^ b0[15] ^ a0[4] ^ a0[8] ^ b0[2] ^ b0[1] ^ b0[6] ^ b0[14] ^ b1[5] ^ a0[0] ^ a0[6]
^ a0[14] ^ b0[5] ^ a1[5] ^ b1[3] ^ a1[1] ^ a1[8] ^ b1[13] ^ b1[7] ^ a1[15] ^ a0[7] ^
a0[12] ^ b0[3] ^ a0[15] ^ b1[10] ^ b1[14] ^ P0

SYND[1]= a0[1] ^ a0[5] ^ a0[13] ^ a1[0] ^ b0[10] ^ b0[13] ^ b0[11] ^ a1[10] ^ ← 501
b1[1] ^ b1[8] ^ b1[15] ^ b1[2] ^ a0[4] ^ a0[8] ^ b0[2] ^ b0[1] ^ b0[6] ^ b0[14] ^ b1[5]
^ a0[3] ^ a0[9] ^ b0[0] ^ a1[2] ^ a1[6] ^ a1[7] ^ a1[14] ^ a1[11] ^ a0[7] ^ a0[12] ^
b0[3] ^ a0[15] ^ b1[10] ^ b1[14] ^ P1

SYND[2]= b0[9] ^ b1[4] ^ b1[6] ^ b1[9] ^ b1[11] ^ b1[12]^ a0[0] ^ a0[6] ^ a0[14] ← 502
^ b0[5] ^ a1[5] ^ b1[3] ^ a1[1] ^ a1[8] ^ b1[13] ^ b1[7] ^ a1[15]^ a0[3] ^ a0[9] ^
b0[0] ^ a1[2] ^ a1[6] ^ a1[7] ^ a1[14] ^ a1[11] ^ a0[7] ^ a0[12] ^ b0[3] ^ a0[15] ^
b1[10] ^ b1[14] ^ P2

SYND[3]= a0[11] ^ a0[1] ^ a0[4] ^ a0[6] ^ a0[9] ^ a0[12] ^ b0[2] ^ b0[12] ^ b0[8] ← 503
^ a1[0] ^ b0[6] ^ b0[9] ^ a1[5] ^ b0[3] ^ a1[3] ^ a1[13] ^ a1[10] ^ b1[4] ^ a1[8] ^
a1[14] ^ b1[0] ^ b0[13] ^ b1[3] ^ a1[6] ^ b1[13] ^ b1[8] ^ b1[11] ^ a1[15] ^ b0[15] ^
P3

SYND[4]= a0[2] ^ a0[5] ^ a0[8] ^ a0[14] ^ b0[0] ^ b0[2] ^ a1[2] ^ b0[10] ^ b0[7] ^ ← 504
b1[0] ^ b0[13] ^ b1[3] ^ a1[6] ^ b1[13] ^ b1[8] ^ b1[10] ^ a1[11] ^ b1[6] ^ b1[1] ^
P4

SYND[5]= a0[10] ^ a0[13] ^ b0[1] ^ b0[5] ^ b0[12] ^ b0[8] ^ a1[0] ^ b0[6] ^ b0[9] ← 505
^ a1[5] ^ b0[3] ^ a1[2] ^ b0[10] ^ b0[7] ^ b1[0] ^ b0[13] ^ b1[3] ^ a1[6] ^ b1[11] ^
b1[7]^ b1[9] ^ b1[15] ^ a1[9] ^ a1[12] ^ P5

SYND[6]= b0[4] ^ b0[11] ^ b0[14] ^ a1[1] ^ a1[7] ^ a0[15] ^ a1[3] ^ a1[13] ^ ← 506
a1[10] ^ b1[4] ^ a1[8] ^ a1[14] ^ b1[13] ^ b1[8] ^ b1[11] ^ b1[10] ^ a1[11] ^ b1[6] ^
b1[1] ^ b1[7]^ b1[9] ^ b1[15] ^ a1[9] ^ a1[12] ^ P6

SYND[7]= a1[4] ^ b1[2] ^ b1[5] ^ b1[12] ^ b1[14] ^ a1[15] ^ b0[15] ^ P7 ← 507

SYND[8] = ( ^a0[15:0] ) ^ ( ^b0[15:0] ) ^ ( ^a1[15:0] ) ^ ( ^b1[15:0] ) ^ P1 ^ P2 ← 508
^ P3 ^ P4 ^ P5 ^ P6 ^ P7 ^ P8

| 220-1 | 220-3 | | 220-5 | 220-7 | |
|---|---|---|---|---|---|
| b1[14] | a1[15] | | | b0[15] | |
| | | | b1[5] | a1[4] | p7 |
| b0[10] | b1[7] | b1[12] | b1[2] | | |
| a0[15] | b1[13] | b1[11] | b1[15] | a1[9] | a1[12] |
| | a1[8] | b1[9] | b1[8] | | |
| | a1[1] | b1[6] | b1[1] | a1[13] | a1[3] |
| b0[3] | b1[3] | b1[4] | a1[10] | b0[4] | p6 |
| | a1[5] | b0[9] | b0[11] | b1[0] | |
| | b0[5] | | b0[13] | b0[7] | |
| | | b0[6] | b0[10] | b0[8] | b0[12] |
| a0[12] | a0[14] | | b0[1] | a1[0] | |
| | a0[16] | | b0[2] | a0[13] | p5 |
| | | | a0[8] | a0[5] | |
| | | | a0[4] | a0[1] | p4 |
| a0[7] | a0[0] | p2 | | a0[2] | |
| | | | | a0[11] | p3 |
| | | | | p0 | |

Actual data, 64 bit in hex: aaaaaaaaaaaaaaaa ⌒ 2001

Actual data in binary: ⌒ 2002
64'h1010101010101010101010101010101010101010101010101010101010101010

⌒ 2003
9 bit Parity for the above data: 010010101 ( p8 p7 p6 p5 p4 p3 p2 p1 p0 )

73 bit data (64+9) after encoding in hex: 0aaaa9aaaa6aaa9aaaa ⌒ 2004

73 bit data (64+9) after encoding in binary:
 010 1010101010101010  01 1010101010101010  01 1010101010101010  01 1010101010101010
⌒ 2005

⌒ 2101
Error in 1ˢᵗ bit position: 73'h0aaaa9aaaa6aaa9aaaa ^ 73'h000_0000_0000_0000_0001

New error data: 73'h0aaaa9aaaa6aaa9aaab ⌒ 2102

Syndrome of the error data: ⌒ 2103
1000 0101 (S8, S7, S6, S5, S4, S3, S2, S1, S0)

Flip the bit position a0[0]. ⌒ 2104

Corrected data: aaaaaaaaaaaaaaaa ⌒ 2105

FIG. 21

Error in 1ˢᵗ and 2ⁿᵈ bit positions: 73'h0aaaa9aaaa6aaa9aaaa ^ 73'h000_0000_0000_0000_0003

New error data: 73'h0aaaa9aaaa6aaa9aaa9

Syndrome of the error data: 00000 1 11 1

Flip the bit positions a0[0] , a0[1] .

Corrected data: aaaaaaaaaaaaaaaa

FIG. 22

Error injection in 1ˢᵗ, 2ⁿᵈ and 3ʳᵈ bit positions:
73'h0aaaa9aaaa6aaa9aaaa ^ 73'h000_0000_0000_0000_0007

New error data: 73'h0aaaa9aaaa6aaa9aaad

Syndrome of the error data: 1000 11 110

Flip the bit positions a0[0] , a0[1] ,a0[2]

Corrected data: aaaaaaaaaaaaaaaa

FIG. 23

ENCODING AND DECODING OF INFORMATION USING A BLOCK CODE MATRIX

FIELD OF THE INVENTION

An embodiment relates to integrated circuit devices ("ICs"). More particularly, an embodiment relates to the encoding and decoding of information for an IC.

BACKGROUND

As memory bit cells of an IC get smaller and/or denser, the likelihood of a Single Event Upset ("SEU") impacting more than one of such memory bit cells at a time increases. However, increasing too is a demand for memory bandwidth, and thus the addition of more parity bits to resolve data corruption issues through use of an Error-Correcting Code ("ECC") would hamper efforts to satisfy such demand for memory bandwidth. Accordingly, it would be desirable and useful to provide an ECC that addresses both of these conflicting issues.

SUMMARY

One or more embodiments generally relate to the encoding and decoding of information for an IC.

An embodiment relates generally to an apparatus. In such an embodiment, an encoder block to receive input data has a first KR-Matrix block. The first KR-Matrix block is configured to: exclusively OR combinations of subsets of data bits of the input data to generate (n−1) parity bits for n a positive integer greater than zero; and exclusively OR a combination of all of the data bits and all the (n−1) parity bits to generate an (n) parity bit.

In various other embodiments of the embodiment described in the preceding paragraph, such apparatus may further include one or more of the following. A decoder can have a second KR-Matrix block. The second KR-Matrix block can be configured to: exclusively OR the combinations of the subsets of the data bits respectively with an associated parity bit of the (n−1) parity bits to generate (n−1) syndrome bits; and exclusively OR the combination of all of the data bits and all the (n) parity bits to generate an (n) syndrome bit. The decoder can be configured to: detect no bit in error, detect and correct a single bit error, detect a double bit error, detect and correct a double adjacent bit error, and detect and correct a triple adjacent bit error. The decoder can be configured to: detect no bit in error, detect and correct a single bit error, detect a double bit error, detect and correct a double adjacent bit error, and detect and correct an M adjacent bit error for M equal to or greater than 3. The decoder can be configured to provide a single bit error status, a double adjacent bit error status, and a triple adjacent bit error status. The first KR–Matrix block can be configured to provide encoded data by arrangement of the data bits and the (n−1) parity bits in a KR-Matrix format. The KR-Matrix format can include twice a number of rows with a same number of columns with respect a Hamming Code configuration of the input data and the parity data. The KR-Matrix format can have approximately a 1-to-1 ratio of occupied cells to unoccupied cells.

Another embodiment relates generally to an encoder. In such an embodiment, a KR-Matrix block is configured to generate parity data for input data. The KR-Matrix block is further configured to: arrange the input data as associated with a matrix format having approximately a 1-to-1 ratio of occupied cells to unoccupied cells; distribute the input data throughout the matrix format in an out-of-sequence order; and populate the matrix format with the parity data generated.

In various other embodiments of the embodiment described in the preceding paragraph, such apparatus may further include one or more of the following. The matrix format can include doubling a number of rows while maintaining a number of columns with respect to a Hamming Code configuration of the input data and the parity data. Some of the parity data may not change location with respect to the Hamming Code configuration. Distribution of the input data throughout the matrix format can include: sets of data bits of the input data with at least two parity bits of the parity data placed at an end of each of the sets of the data bits to provide sequences of 1-tuple bits; two adjacent bits of each of the sequences paired to provide 2-tuple bits; and three adjacent bits of each of the sequences concatenated to provide 3-tuple bits. Distribution of the input data throughout the matrix format can include: at least two associated parity bits of the parity data placed in each of a plurality of sets of the input data to provide sequences of singleton bits; two adjacent bits of each of the sequences paired to provide 2-tuple bits; and three adjacent bits of each of the sequences concatenated to provide 3-tuple bits. The at least two associated parity bits can be respectively placed at an end of the sequences.

Yet another embodiment relates generally to another apparatus. A decoder is coupled to memory to receive encoded data. The decoder is configured to: generate syndrome information from the encoded data; and decode the encoded data to provide decoded data. The decoder includes a matrix function configured to: detect and correct a double adjacent bit error; and detect and correct a triple adjacent bit error.

In various other embodiments of the embodiment described in the preceding paragraph, such apparatus may further include one or more of the following. The matrix function can be further configured to: detect no bit in error, detect and correct a single bit error, and detect a double bit error. The matrix function can be further configured to: detect no bit in error, detect and correct a single bit error, detect a double bit error, detect and correct a double adjacent bit error, and detect and correct an M adjacent bit error for M equal to or greater than 3. The decoder can be configured to provide a single bit error status, a double adjacent bit error status, and a triple adjacent bit error status. The matrix function can be configured to arrange data bits and parity bits of the encoded data to generate syndrome bits. The matrix function can use a matrix format which doubles a number of rows with a same number of columns with respect to a Hamming Code configuration of the data bits and the parity bits. The matrix format can have approximately a 1-to-1 ratio of occupied cells to unoccupied cells. The arrangement of the encoded data can include: sets of the data bits with at least two parity bits of the parity bits placed at an end to provide sequences of singleton bits; two adjacent bits of each of the sequences paired to provide 2-tuple bits; and three adjacent bits of each of the sequences concatenated to provide 3-tuple bits. The arrangement of the encoded data can include: two associated parity bits of the parity bits placed in each of a plurality of sets of the data bits to provide sequences of 1-tuple bits; two adjacent bits of each of the sequences paired to provide 2-tuple bits; and three adjacent bits of each of the sequences concatenated to provide 3-tuple bits. The two associated parity bits can be placed at an end of the data bits to provide the sequences. Generation of the syndrome information from the encoded data can include exclusive OR resources configured to exclusively OR: combinations of subsets of the data bits and an associated parity bit of the parity bits from a matrix format to generate each bit(n−1) syndrome bit for n a positive integer greater than one; and a combination of all of the data bits and all of the parity bits from the encoded data to generate a bit(n) syndrome bit.

BRIEF DESCRIPTION OF THE DRAWINGS

Accompanying drawings show exemplary embodiments. However, the accompanying drawings should not be taken to limit the embodiments shown, but are for explanation and understanding only.

FIG. 3 is a table diagram depicting an exemplary embodiment of a "Kumar-Rahul Code" matrix ("KR-Matrix").

FIG. 4 is a listing diagram depicting an exemplary embodiment of parity bit equations for the KR-Matrix of FIG. 3.

FIG. 5 is a listing diagram depicting an exemplary embodiment of syndrome bit equations for the KR-Matrix of FIG. 3.

FIG. 10 is the table diagram of FIG. 3 depicting an exemplary embodiment of the KR-Matrix 300 for determining a P0 parity bit or a SYND[0] ("S0") syndrome bit.

FIG. 12 is the table diagram of FIG. 3 depicting an exemplary embodiment of the KR-Matrix for determining a P2 parity bit or a SYND[2] ("S2") syndrome bit.

FIG. 20 is a flow diagram depicting an example of encoding using the KR-Matrix of FIG. 3.

FIGS. 21 through 23 are respective flow diagrams depicting examples of decoding using the KR-Matrix of FIG. 3 for the encoding example of FIG. 20.

DETAILED DESCRIPTION

Figure 1:
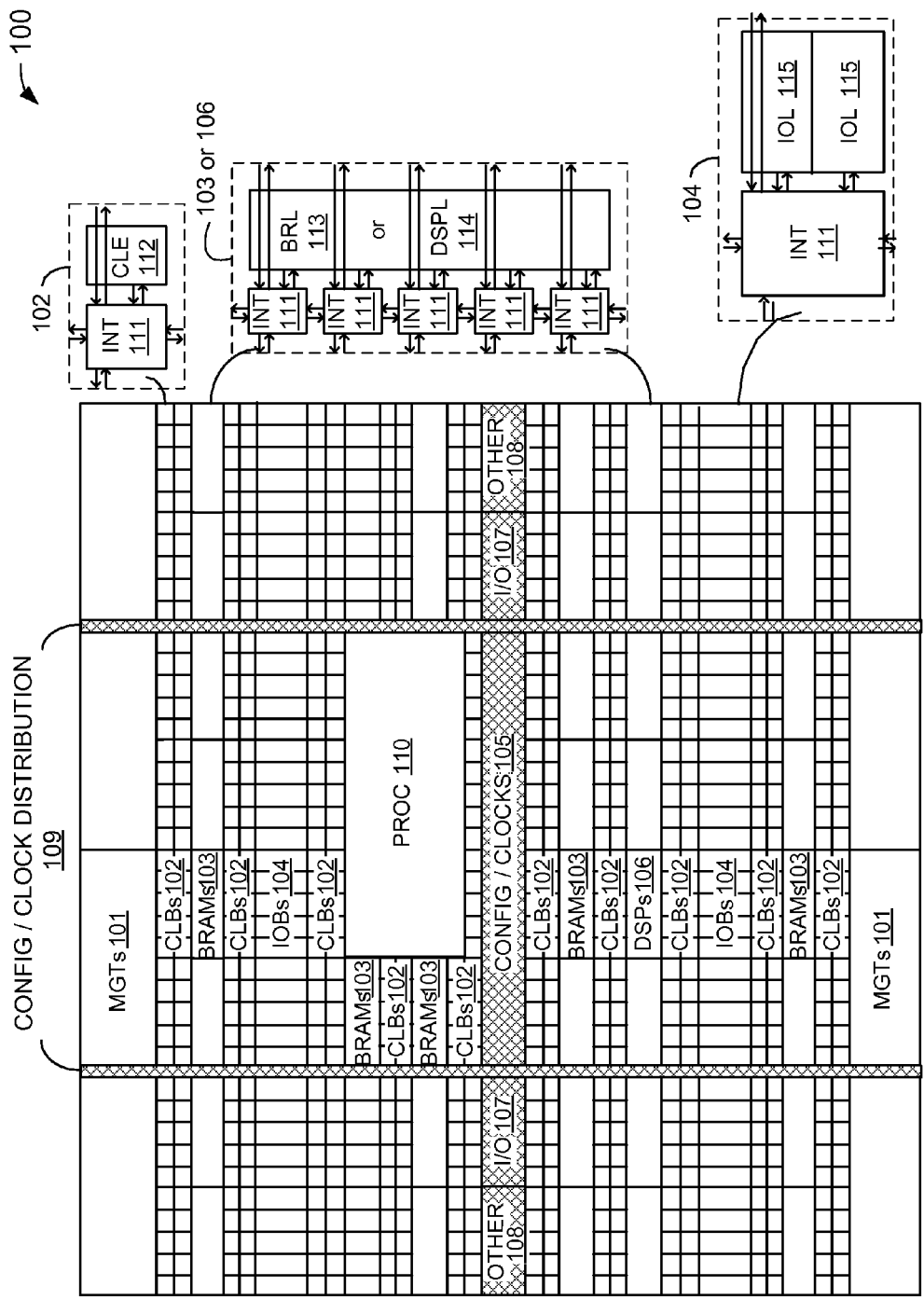
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

There are any of a variety of block codes and sizes of block codes which may be described. Thus, for purposes of clarity by way of example and not limitation, a 64-bit with 8 parity bit Hamming Code configuration, which may be realized as a matrix with x-rows and y-columns, is described. In such a Hamming Code configuration of data bits and parity bits, such an ECC is capable of: detecting no bit in error; detecting and correcting a 1-bit error; and detecting, but not correcting, a 2-bit error. However, as memory bit cells become denser and/or smaller, events upsetting state of such memory bit cells, such as Single Event Upsets, are more likely to corrupt more than two of such memory bit cells at a time.

With the above general understanding borne in mind, various embodiments for detecting and correcting, as well as detecting, more corrupted bits than an equivalently sized Hamming Code configuration are generally described below. More particularly, for a same data bit size and an n+1 parity bit size as compared with a Hamming Code configuration, significantly more corrupted bits may be detected and corrected. For purposes of clarity by way of example and not limitation, using only 9 parity bits, a 64-bit ECC is described below that allows for: detection of no bit errors; detection and correction of 1-tuple bit errors; detection and correction of 2-tuple adjacent bit errors; detection of nonadjacent double bit errors; and detection and correction of 3-tuple adjacent bit errors.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
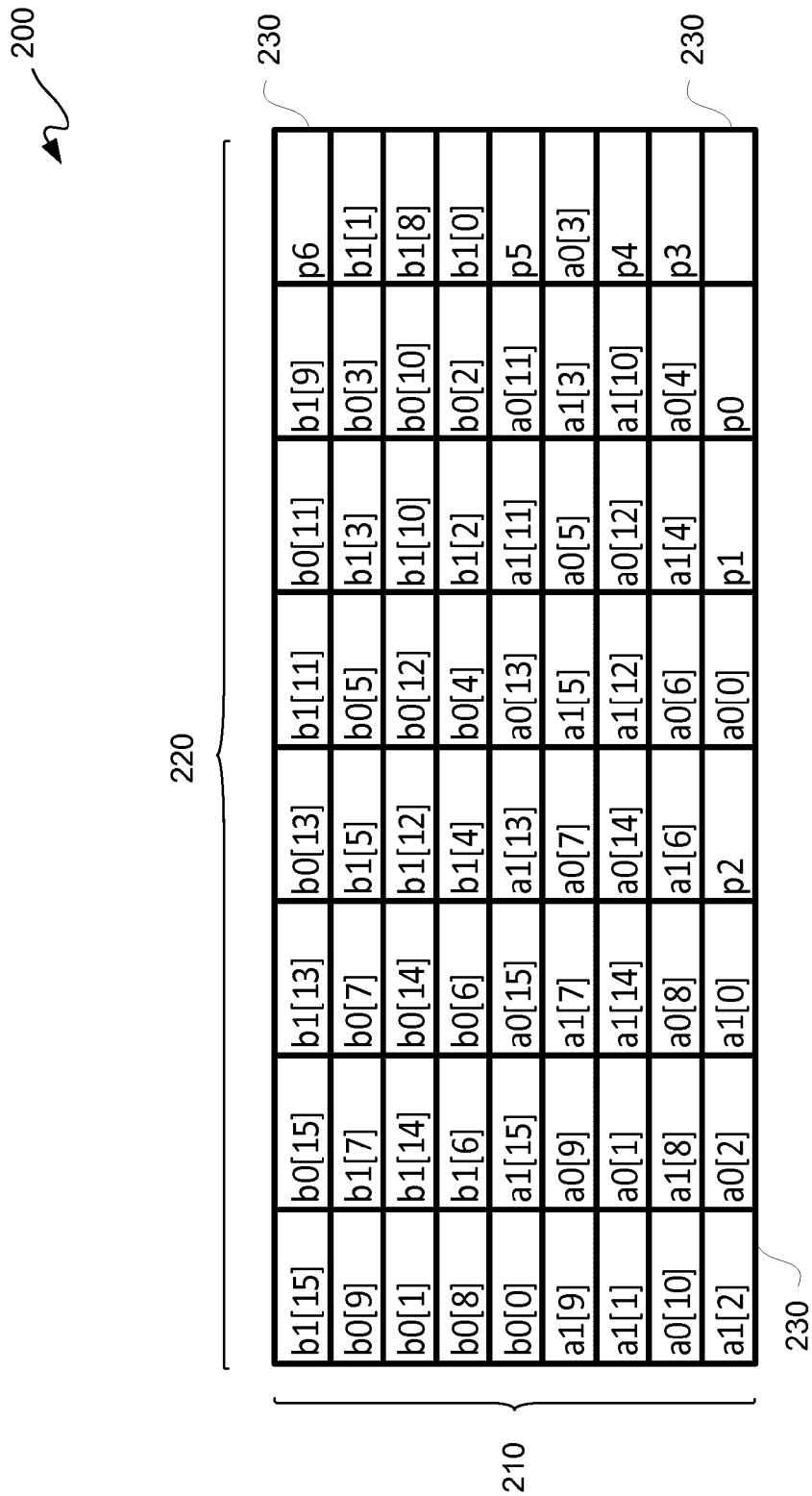
FIG. 2 is a table diagram depicting an exemplary embodiment of a conventional Hamming Code Matrix ("H-matrix").

FIG. 2 is a table diagram depicting an exemplary embodiment of a conventional Hamming Code Matrix ("H-matrix") 200. H-matrix 200 in this exemplary embodiment is for 64-bit data. More particularly, there are four sets of 16 bits each, namely bits a0[15:0], a1[15:0], b0[15:0], and b1[15:0]. Additionally, H-matrix 200 includes seven parity bits p0 through p6, and an eighth parity bit not included in H-matrix 200 is used to set overall parity, namely either odd or even parity. Thus, in this example, 64-bit Hamming Error-Correcting Code ("ECC") with 8 parity bits is used.

In this embodiment, H-matrix 200 includes nine rows 210 and eight columns 220 for a total of 72 matrix cells 230. As there are 64 bits of data and 7 bits of parity for a total of 71 bits, one of matrix cells 230 is unoccupied. The unoccupied matrix cell 230 is cell (9, 8), and the p7 parity bit takes that zeroth position, namely cell (9,8) in this example.

FIG. 3 is a table diagram depicting an exemplary embodiment of a "Kumar Rahul Code" matrix ("KR-Matrix") 300. KR-Matrix 300 is for a block code, as described herein. For purposes of clarity by way of example and not limitation, KR-Matrix 300 is further described with reference to a 64 data bit and 9 parity bit embodiment; however, KR-Matrix 300 may be used with any block code size. Even though KR-Matrix 300 is described for writing and reading encoded data from Static Random Access Memory ("SRAM"), such as block RAM ("BRAM") for example, it should be understood that KR-Matrix 300 may be for writing to and reading from any form of memory. Additionally, KR-Matrix 300 is not a Hamming Code matrix, namely not an H-matrix, as shall be further appreciated from the following description.

For purposes of clarity by way of example and not limitation, this exemplary embodiment of KR-Matrix 300 is depicted for 64-bit data; however, fewer or more than 64 data bits may be used, which number of data bits may affect the number of parity bits. Continuing the above example, in this exemplary embodiment, KR-Matrix 300 has four sets of 16 bits each, namely data bits a0[15:0], a1[15:0], b0[15:0], and b1[15:0]. These four sets of data are distributed in an out-of-sequence order throughout KR-Matrix 300. Additionally, for this embodiment, KR-Matrix 300 includes eight parity bits P0 through P7. Also, there is a ninth parity bit P8, which is used to make all bits a set parity. For this example of 64 data bits and parity bits P0 to P7, namely 72 bits, an additional parity bit P8 is used to make all 73 bits either odd or even parity after encoding. For purposes of clarity by way of example and not limitation, it shall be assumed that overall even parity is used for all 73 bits; even though, in other embodiments overall odd parity may be used.

For example, if a 72-bit count is odd parity, namely a 1, then parity bit P8 will be 1 to make such overall parity even, which information or setting may be used for decoding as described below in additional detail. Furthermore, for example, if a 72-bit count is even parity, namely a 0, then parity bit P8 will be 0 to keep such overall parity even. Thus, parity bit P8 may be used for either an odd or an even parity. Again, by odd parity or even parity, it is generally meant a parity of all data and parity bits. In this example, such parity is determined by bits a0[15:0], a1[15:0], b0[15:0], and b1[15:0] and P0 through P7.

Parity of an encoded word ("codeword") may be set either to a logic 1 ("odd parity") or logic 0 ("even parity") with use of a parity bit, such as parity bit P8 in this example. Along those lines, parity bit P8 may be set to make parity of a codeword either odd or even. Parity bits P0 through P8 are generated by an encoder, and parity bit P8 may be stored in association with a codeword, including in a same block of memory as the codeword with which it is associated.

In this embodiment, KR-Matrix 300 includes eighteen rows 210 and eight columns 220 for a total of 144 matrix cells 230. For KR-Matrix 300, the number of rows 210 is doubled while keeping the number of columns 220 the same. Thus there are twice as many matrix cells 230 in KR-Matrix 300 as compared with H-matrix 200. Many of the added matrix cells 230 in KR-Matrix 300 are unoccupied. Generally, by doubling a number of rows while maintaining a number of columns with respect to a block size of data and parity bits, a KR-Matrix 300 format may be obtained with rearrangement of data bits while keeping parity bits P0 through P6 in there same locations as compared with parity bits p0 through p6 of H-matrix 200 of FIG. 2. Additionally, an extra parity bit P7 is added. Both H-matrix 200 of FIG. 2 and KR-Matrix 300 may have an overall parity bit, which in the example embodiment of KR-Matrix 300 is a parity bit P8. By adding rows with unoccupied cells unique data spaces for parity bits may be provided, as described below in additional detail. Along those lines, a KR-Matrix format has approximately a 1-to-1 ratio of occupied cells to unoccupied cells. The word approximately is used herein to indicate a variation of no more than ±20%.

Data bits a0[15:0], a1[15:0], b0[15:0], and b1[15:0] in KR-Matrix 300 are reordered as compared with those data bits in H-matrix 200. This reordering of data bits effectively means that parity bits P0 through P6 of KR-Matrix 300 are not the same as parity bits p0 through p6 of H-matrix 200, even though such parity bits are located in the same locations in both matrices. In other words, parity data in a Hamming Code configuration or H-matrix 200 is located in the same positions relative to one another as corresponding parity data in KR-Matrix 300, even though the number of rows is doubled as between the two different types of matrices.

Some of matrix cells 230 may be thought of as unoccupied; however, data and parity bits of KR-Matrix 300 are written to and read from memory cells of a memory array. Each KR-Matrix may for example be read as a block, namely with a starting address and a block length, which in this example is 73 bits. In such an embodiment, such unoccupied matrix cells 230 are empty, namely these positions are not used. Accordingly, hardware and/or software may be used to avoid use of these positions. For example, encoding and/or decoding circuitry may be configured to ignore or effectively skip all unoccupied matrix cells 230. However, these additional cells provide for a more robust property of uniqueness or mutual exclusivity.

Generally, a Hamming Code is used to encode input data into a codeword using H-matrix 200 and then write such codeword into memory. If any Single Event Upset ("SEU") upsets at most a single bit of data stored in such memory, then with an ECC or a forward error correction ("FEC") code, such as a Hamming Code for example, such encoded data may be decoded using H-matrix 200. Additionally, such upset bit, namely the corrupted data bit, may be corrected. Syndromes or check bits generated using H-matrix 200 may be used to detect which bit location is in error and correct it. Furthermore, if two bits are upset, then such error may be detected.

However, H-matrix 200 conventionally cannot detect and correct data having two adjacent bits corrupted, such as by an SEU or other bit-corrupting event. Furthermore, H-matrix 200 conventionally cannot detect and correct a data error having all three adjacent bits corrupted, such as by an SEU or other bit-corrupting event.

Because memory cells are substantially smaller than in the past, the likelihood of an SEU or soft error of multiple adjacent bits may have increased. For example, an integrated circuit exposed to external ionic or electromagnetic radiation may be more likely to have two or more adjacent memory cells affected by such external radiation because memory cells are more densely packed than in the past.

Figure 4:
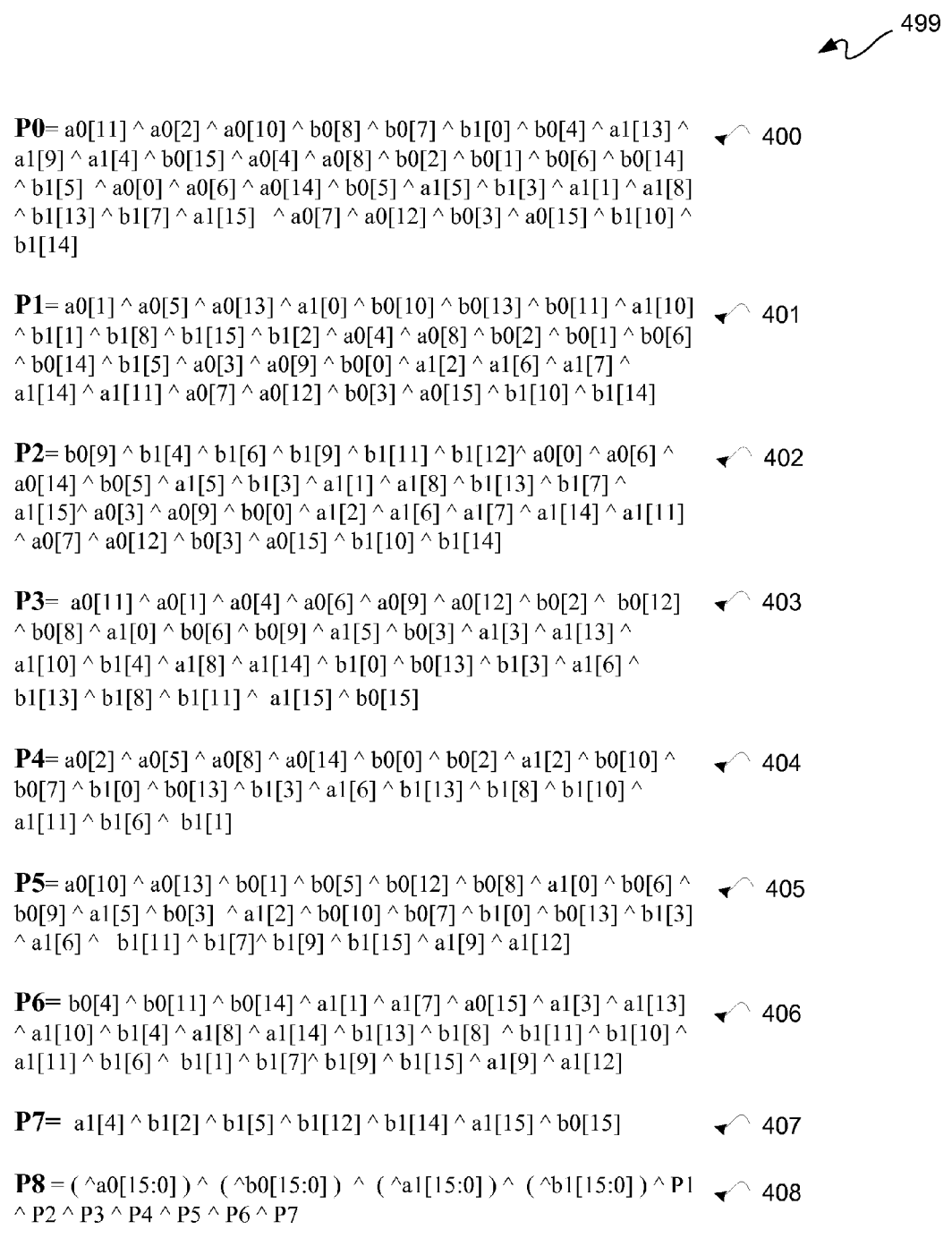

FIG. 4 is a listing diagram depicting an exemplary embodiment of parity bit equations 499 for KR-Matrix 300 of FIG. 3. In other words, parity bit equations 499 are for generating parity bits P0 through P7 for KR-Matrix 300 and parity bit P8, which may be concatenated to parity bits P0 through P8 for storage with them. Equations 400 through 408 respectively are for generating parity bits P0 through P8. In the notation of Equations 400 through 408, the symbol "^" denotes an exclusive-OR ("XOR") operation. The notation in Equation 408 of "(^a0[15:0])" denotes XOR operation of all bits in the parenthesis, namely for this example a0[15]^a0[14]^a0[13]^a0[12]^a0[11]^a0[10]^a0[9]^a0[8]^a0[7]^a0[6]^a0[5]^a0[4]^a0[3]^a0[2]^a0[1]^a0[0]. Equations 400 through 407 generally represent XORing subsets of input data.

An encoder may be configured to generate parity bits P0 through P8 in accordance with Equations 400 through 408 by arranging input data into such equations or format, where such arrangement may be controlled by software or hardware or a combination thereof. After generating parity bits P0 through P8, such encoder may be configured to provide such parity bits P0 through P8 with data bits a0[15:0], a1[15:0], b0[15:0], and b1[15:0] in an arrangement for subsequent decoding.

Generally, parity bits P0 through P7 are individual parity bits; however, parity bit P8 may be thought of as an overall parity bit formed by XORing all data bits and all parity bits, namely for example parity bits P0 and P7. In other words, n−1, for n a positive integer greater than zero, parity bits are generated first. An nth parity bit is generated using all data bits and all (n−1) parity bits.

FIG. 5 is a listing diagram depicting an exemplary embodiment of syndrome bit equations 599 for KR-Matrix 300 of FIG. 3. Syndrome bit equations 599 are for generating syndrome bits SYND[0] ("S0") through SYND[7] ("S8") of an encoded KR-Matrix 300. In other words, syndrome bit equations 599 are for generating syndrome bits SYND[0] through SYND[8] for decoding of an encoded or rearranged data in KR-Matrix 300. Equations 500 through 508 respectively are for generating syndrome bits SYND[0] through SYND[8]. Equations 500 through 507 generally represent XORing subsets of input data with an associated parity bit.

Generally, syndrome bits S0 through S7 are individual decode parity bits or check bits; however, syndrome bit P8 may be thought of as an overall parity bit formed of all data bits and all parity bits, namely for example parity bits P0 through P8. In other words, n−1, for n a positive integer greater than zero, syndrome bits are generated from subsets of input data bits and an associated (n−1) parity bit. An nth syndrome bit is generated using all data bits and all parity bits.

Equations 500 through 508 respectively are almost the same as Equations 400 through 408. To obtain Equations 500 through 508 from Equations 400 through 408, Equations 400 through 408 each include one additional XOR operation with a parity bit. More particularly, Equation 500 is Equation 400 with the addition of an XOR operation of parity bit P0. Likewise, Equation 501 is Equation 401 with the addition of an XOR operation of parity bit P1. Thus, by respectively XORing parity bits P0 through P8 with Equations 400 through 408, Equations 500 through 508 may be obtained.

Effectively Equations 500 through 508 are parity equations for decoding. Along those lines, a decoder, whether in hardware, software, or a combination thereof, may be configured in accordance with Equations 500 through 508. Furthermore, an encoder in accordance with Equations 400 through 408 may have coupled thereto respective XOR circuits for XORing P0 through P8. In such an embodiment, control circuitry may be used such that: in an encode mode, such XOR circuits for XORing P0 through P8 respectively with Equations 400 through 408 are not used; and in a decode mode, such XOR circuits for XORing P0 through P8 respectively with Equations 400 through 408 are used. However, continuing the above-example of SRAM, and in particular BRAM, where such BRAM is dual ported allowing for memory write and read operations to different memory locations in a same clock cycle, separate encode and decode logic circuits may be used.

Figure 6:
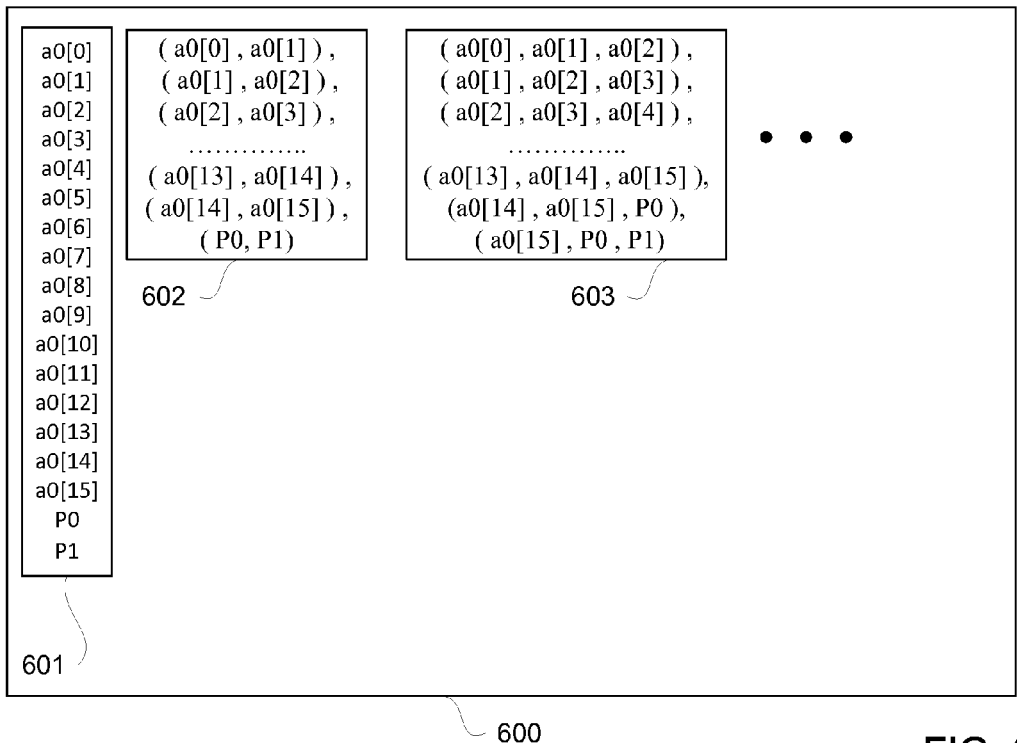
FIG. 6 is a block diagram depicting an exemplary embodiment of information arrangements for the KR-Matrix of FIG. 3.

FIG. 6 is a block diagram depicting an exemplary embodiment of information arrangements 600 for KR-Matrix 300 of FIG. 3. For this exemplary embodiment, there are three information arrangements in information arrangements 600, namely: (1) 1-tuple bits ("1-tuples" or singletons) of bits 601, (2) 2-tuple bits ("2-tuples") of bits 602, and (3) 3-tuple bits ("3-tuples") of bits 603. More and longer bit strings may be used for longer adjacent bit errors. Even though the terms "2-tuples" and "3-tuples" are used for example, it does not mean that all bits with such set are identical, even though they may be. Thus, for example, a 2-tuple of bits may be any of (1,0), (0,1), (1,1), or (0,0).

Singleton bits 601 are individual data and parity bits ordered in sequences as follows: a0[0] through a0[15], P0, and P1. In other words, parity bits P0 and P1 in order are located at the bottom end of the sequence of data bits a0[0] through a0[15] to provide 1-tuples 601. There is one combination of this sequence of bits, namely there are 18 adjacent bits in this sequence of 1-tuples 601. In each sequence of an ordered input data subset, at least two parity bits in order are located at the bottom end, namely after the highest order data bit, of such sequence, as described below in additional detail.

Two adjacent bits from singleton bits 601 are used to form 2-tuples 602, as follows: (a0[0], a0[1]), (a0[1], a0[2]), . . . , (a0[13], a0[14]), (a0[14], a0[15]), (P0, P1). As there are 18 1-tuples 601 in this exemplary embodiment, there are 17 combinations of 2-tuple adjacencies of bits, namely there are 17 combinations of 2-tuples 602 as there is no wrapping. Once a last singleton bit 601 is used in forming a 2-tuple, as described herein, then formation of 2-tuples 602 is completed, as there is no wrap around ('wrapping").

Three adjacent bits are associated or concatenated from singleton bits 601 to form 3-tuples 603 of adjacent bits, as follows: (a0[0], a0[1], a0[2]), (a0[1], a0[2], a0[3]), . . . , (a0[12], a0[13], a0[14]), (a0[13], a0[14], a0[15]), (a0[14], a0[15], P0), (a0[15], P0, P1). Once a last singleton bit 601 is used in forming a 3-tuple, as described herein, then formation of 3-tuples 603 is completed, as there is now wrapping. Along those lines, for this exemplary embodiment, there are 16 combinations of 3-tuple adjacencies of bits.

Thus, for this exemplary embodiment, 1-tuples 601, 2-tuples 602, and 3-tuples 603 may each be formed from a sequence of 1-tuples 601 to provide a first information arrangement 600 of information arrangements 600 through 900, as described below in additional detail with respective reference to FIGS. 7 through 9. In other words, there is one data arrangement for each subset of data, which for this example there are four subsets of data, namely a0, b0, a1, and b1.

Figure 7:
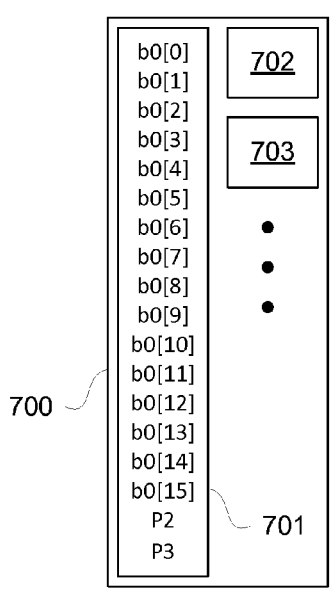
FIGS. 7 through 9 are block diagrams depicting respective exemplary embodiments of information arrangements, respectively, for the KR-Matrix of FIG. 3.
Figure 8:
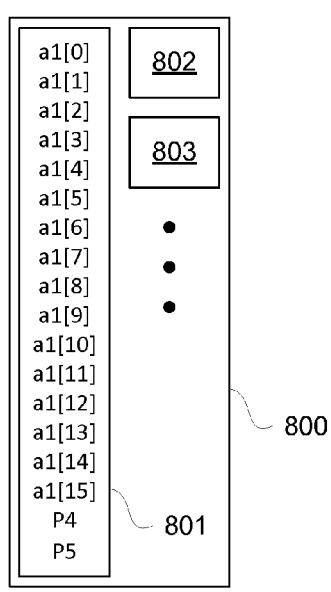
Figure 9:
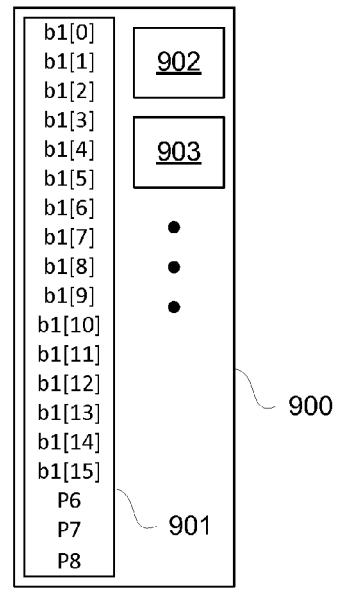

FIGS. 7 through 9 are block diagrams depicting respective exemplary embodiments of information arrangements 700, 800, and 900, respectively, for KR-Matrix 300 of FIG. 3. For this exemplary embodiment, in each of information arrangements 700, 800, and 900, there are: 1-tuples, 2-tuples, and 3-tuples. However, only 1-tuples 701, 801, and 901 for data sets b0[15:0], a1[15:0], and b1[15:0], respectively, for KR-Matrix 300 of FIG. 3 are illustratively depicted in detail for purposes of clarity and not limitation, as 2-tuples and 3-tuples may be formed as previously described with reference to 2-tuples 602 and 3-tuples 603, respectively. Along those lines, each of 1-tuples 601, 701, 801, and 901 has at least two different parity bits, as described below in additional detail.

With reference to FIG. 7, 1-tuples 701 are individual data and parity bits ordered as follows: data bits b0[0] through b0[15], P2, and P3. In other words, parity bits P2 and P3 in order are located at the bottom end of the sequence of data bits b0[0] through b0[15]. Formation of 2-tuples 702 and 3-tuples 703 follows from formation of 2-tuples 602 and 3-tuples 603, except that 1-tuples 701 are used in such formation instead of 1-tuples 601.

With reference to FIG. 8, 1-tuples 801 are individual data and parity bits ordered as follows: data bits a1[0] through a1[15], P4, and P5. In other words, parity bits P4 and P5 in order are located at the bottom end of the sequence of data bits a1[0] through a1[15]. Formation of 2-tuples 802 and 3-tuples 803 follows from formation of 2-tuples 602 and 3-tuples 603, except that 1-tuples 801 are used in such formation instead of 1-tuples 601.

With reference to FIG. 9, 1-tuples 901 are individual data and parity bits ordered as follows: data bits b1[0] through b1[15], P6, P7, and P8. In other words, parity bits P6, P7 and P8, in such sequence, are located at the bottom end of the sequence of data bits b1[0] through b1[15]. Formation of 2-tuples 902 and 3-tuples 903 follows from formation of 2-tuples 602 and 3-tuples 603, except that 1-tuples 901 are used in such formation instead of 1-tuples 601. Furthermore, 1-tuples 901 is a one combination of 19 adjacent bits, whereas each of 1-tuples 601, 701, and 801 are separate combinations of 18 adjacent bits. Along those lines, there are 17 and 16 respective sets of combinations of 2-tuples and 3-tuples for each of information arrangements 600, 700, and 800. However, information arrangement 900 has 18 and 17 combinations of 2-tuples 902 and 3-tuples 903, respectively, due to having one more bit than each of the other information arrangements.

FIG. 10 is the table diagram of FIG. 3 depicting an exemplary embodiment of KR-Matrix 300 for determining a P0 parity bit or a SYND[0] ("S0") syndrome bit. Bits in columns 220-1, 220-3, 220-5, and 220-7 without parity bit P0 are XOR processed as previously described to generate a P0 parity bit, which is then added to the bottom row of column 220-7. In other words, every other column 220, starting from an initial column 220-1, is used. For generation of an S0 syndrome bit, bits in columns 220-1, 220-3, 220-5, and 220-7 with parity bit P0 are XOR processed as previously described to generate an S0 syndrome bit. Again, in other words, every other column 220, starting from an initial column 220-1, is used.

Figure 11:
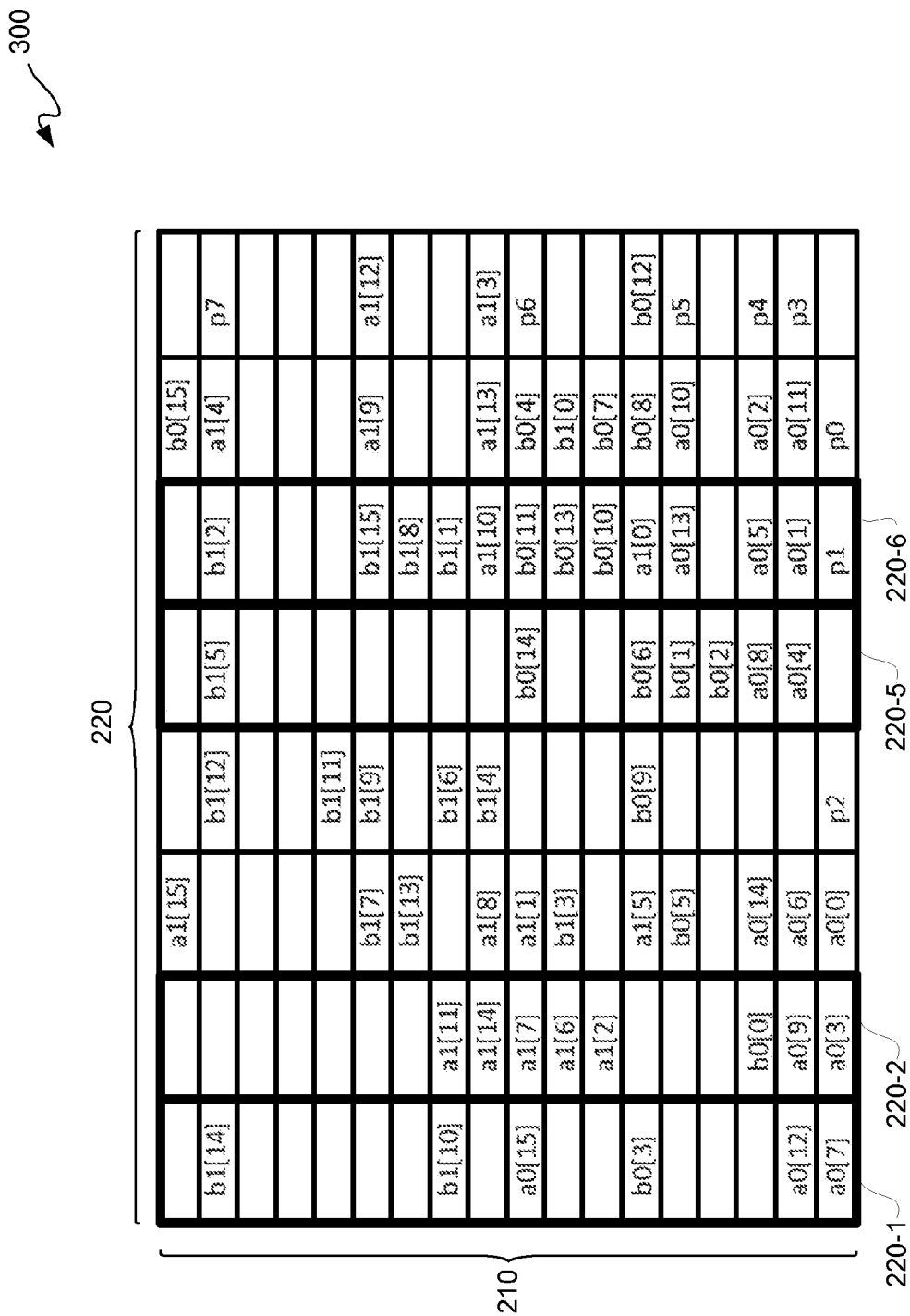
FIG. 11 is the table diagram of FIG. 3 depicting an exemplary embodiment of the KR-Matrix for determining a P1 parity bit or a SYND[1] ("S1") syndrome bit.

FIG. 11 is the table diagram of FIG. 3 depicting an exemplary embodiment of KR-Matrix 300 for determining a P1 parity bit or a SYND[1] ("S1") syndrome bit. Bits in columns 220-1, 220-2, 220-5, and 220-6 without parity bit P1 are XOR processed as previously described to generate a P1 parity bit, which is then added to the bottom row of column 220-6. In other words, every other two columns 220, starting from an initial column 220-1, are used. For generation of an S1 syndrome bit, bits in columns 220-1, 220-2, 220-5, and 220-6 with parity bit P1 are XOR processed as previously described to generate an S1 syndrome bit. Again, in other words, every other two columns 220, starting from an initial column 220-1, are used.

Figure 12:
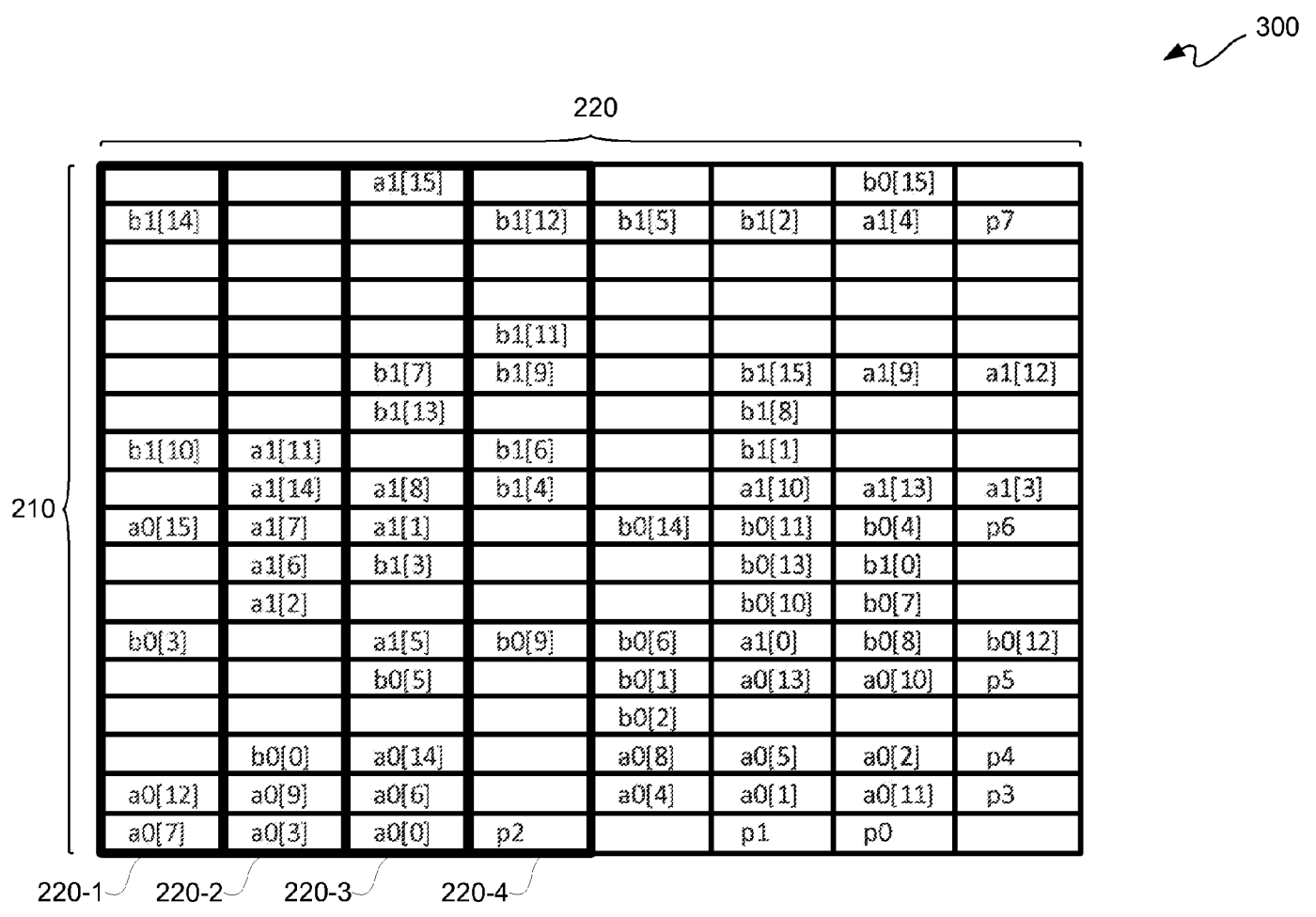

FIG. 12 is the table diagram of FIG. 3 depicting an exemplary embodiment of KR-Matrix 300 for determining a P2 parity bit or a SYND[2] ("S2") syndrome bit. Bits in columns 220-1, 220-2, 220-3, and 220-4 without parity bit P2 are XOR processed as previously described to generate a P2 parity bit, which is then added to the bottom row of column 220-4. In other words, every other four columns 220, starting from an initial column 220-1, are used. For generation of an S2 syndrome bit, bits in columns 220-1, 220-2, 220-3, and 220-4 with parity bit P2 are XOR processed as previously described to generate an S2 syndrome bit. Again, in other words, every other four columns 220, starting from an initial column 220-1, are used.

To this point, with reference to FIGS. 10 through 12, a binary progression for selection of columns is used. In other words, $2^0, 2^1, 2^2, \ldots$, column(s) are selected at a time before skipping $2^0, 2^1, 2^2, \ldots$, column(s) at a time, as respectively applicable. Once the binary progression is completed for all column isolatable parity bits for a KR-Matrix 300, then another binary progression may be used for all row isolatable parity bits for a KR-Matrix 300. Of course, the actual order of determining parity bits P0 through P7 and/or syndrome bits S0 through S8 is irrelevant, as any order may be used. However, parity bit P8 may be determined after determination of parity bits P0 through P7.

Figure 13:
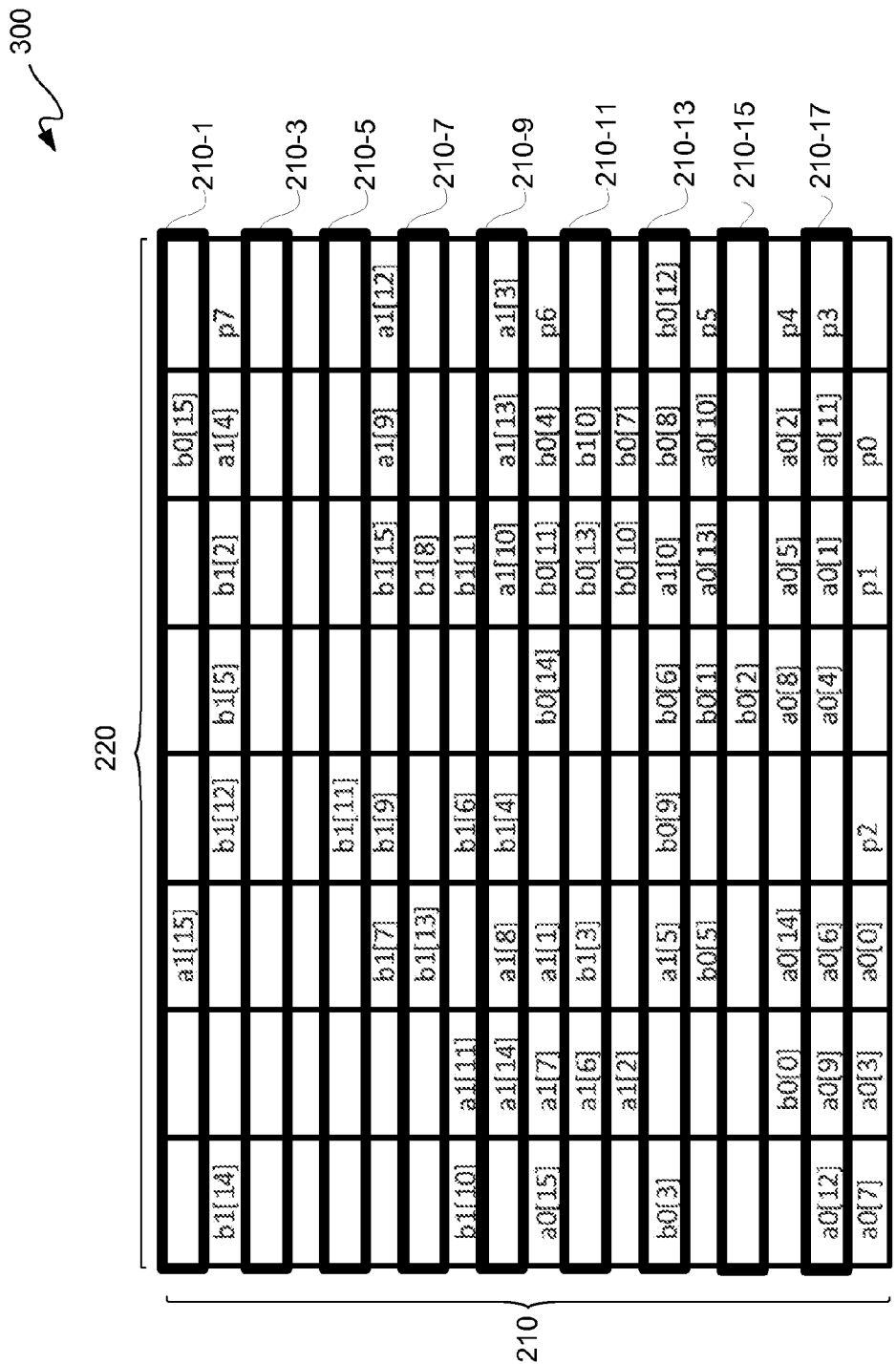
FIG. 13 is the table diagram of FIG. 3 depicting an exemplary embodiment of the KR-Matrix for determining a P3 parity bit or a SYND[3] ("S3") syndrome bit.

FIG. 13 is the table diagram of FIG. 3 depicting an exemplary embodiment of KR-Matrix 300 for determining a P3 parity bit or a SYND[3] ("S3") syndrome bit. Bits in rows 210-1, 210-3, 210-5, 210-7, 210-9, 210-11, 210-13, 210-15, and 210-17 without parity bit P3 are XOR processed as previously described to generate a P3 parity bit, which is then added to the end of row 210-17. In other words, every other row 210, starting from an initial row 210-1, is used. For generation of an S3 syndrome bit, bits in rows 210-1, 210-3, 210-5, 210-7, 210-9, 210-11, 210-13, 210-15, and 210-17 with parity bit P3 are XOR processed as previously described to generate an S3 syndrome bit. Again, in other words, every other row 210, starting from an initial row 210-1, is used.

Figure 14:
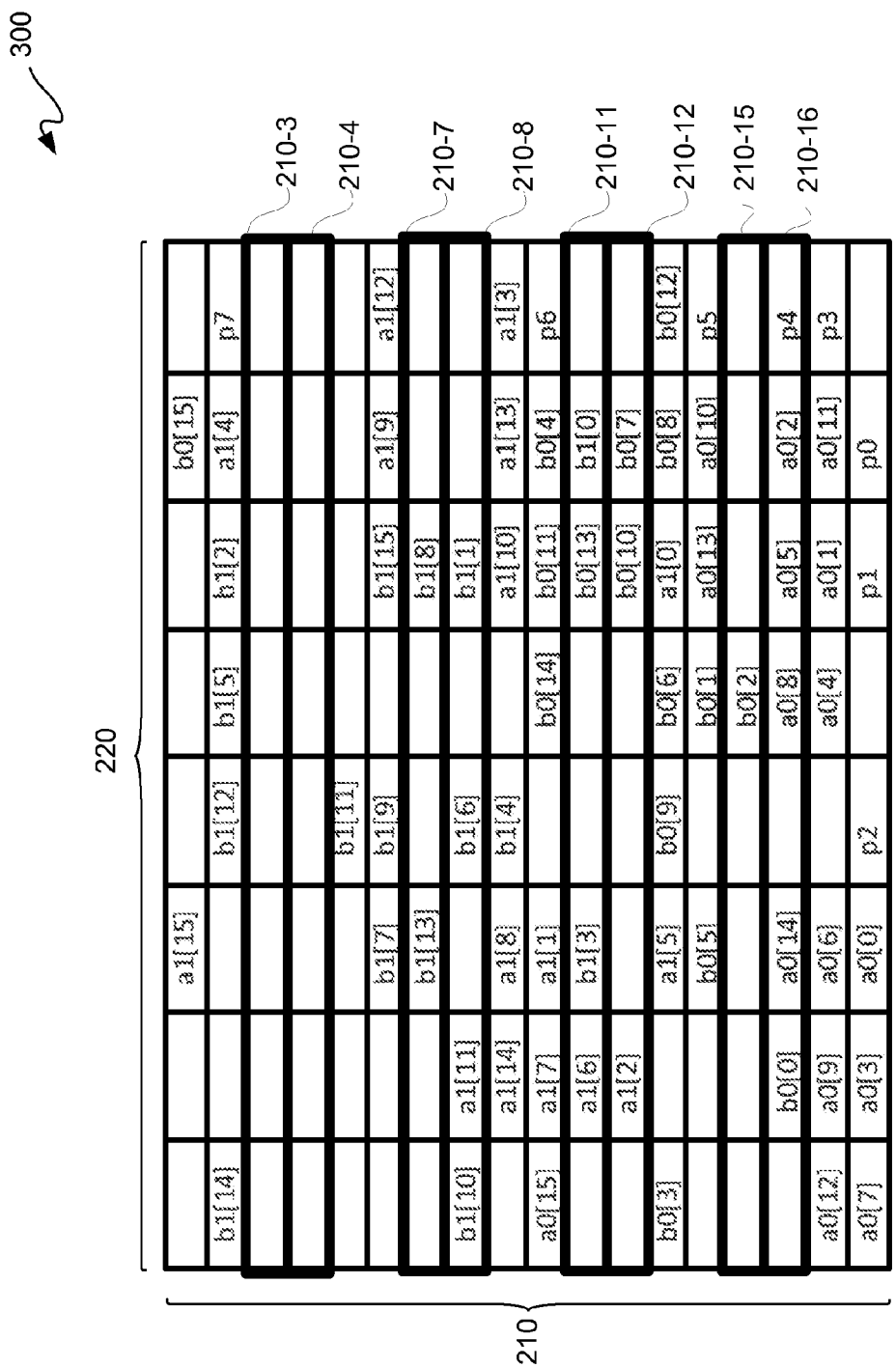
FIG. 14 is the table diagram of FIG. 3 depicting an exemplary embodiment of the KR-Matrix for determining a P4 parity bit or a SYND[4] ("S4") syndrome bit.

FIG. 14 is the table diagram of FIG. 3 depicting an exemplary embodiment of KR-Matrix 300 for determining a P4 parity bit or a SYND[4] ("S4") syndrome bit. Bits in rows 210-7, 210-8, 210-11, 210-12, 210-15, and 210-16 without parity bit P4 are XOR processed as previously described to generate a P4 parity bit, which is then added to the end of row 210-16. As there is no data or parity information stored in rows 210-3 and 210-4, there is no need to access those rows. For generation of an S4 syndrome bit, bits in rows 210-7, 210-8, 210-11, 210-12, 210-15, and 210-16 with parity bit P4 are XOR processed as previously described to generate an S4 syndrome bit.

Generation of a P5 parity bit, a SYND[5] ("S5") syndrome bit, a P6 parity bit, a SYND[6] ("S6") syndrome bit, a P7 parity bit, and a SYND[7] ("S7") syndrome bit follow from Equations of FIGS. 4 and 5 for processing bits in rows of KR-Matrix 300 and from the previous description, and thus are not described in detail herein for purposes of clarity. A P8 parity bit may be determined by XORing all information in KR-Matrix 300 to determine a parity bit P8, and a SYND[8] ("S8") syndrome bit may be determined by XORing all information in KR-Matrix 300 along with a P8 parity bit therefor.

Figure 15:
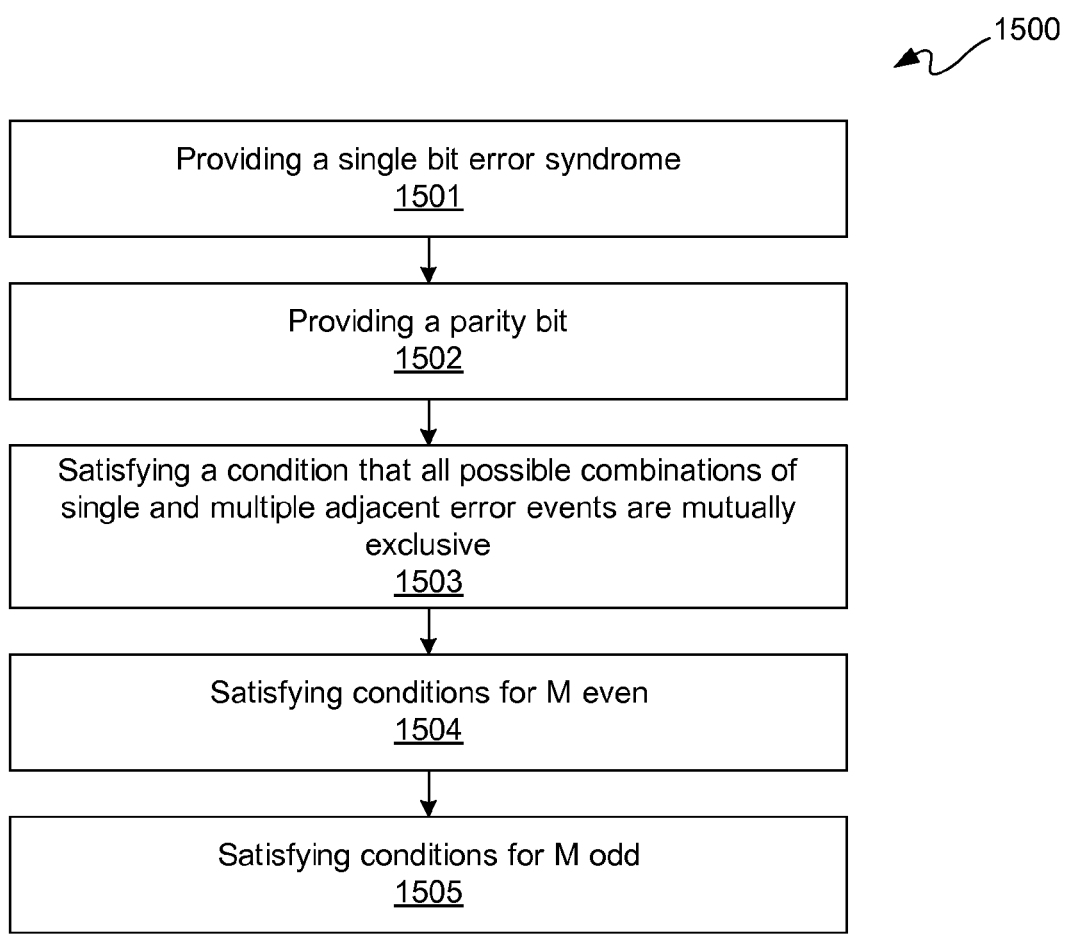
FIG. 15 is a flow diagram depicting an exemplary embodiment of a KR-Matrix generation flow.

FIG. 15 is a flow diagram depicting an exemplary embodiment of a KR-Matrix generation flow 1500. Continuing the above description, KR-Matrix 300 may operate in any of the following modes or have the following capabilities: (0) detect no bit in error, (1) detect and correct a 1-bit error, (2) detect a 2-nonadjacent bit error, and/or (3) detect and correct an M-adjacent bit error for M greater than or equal to two. For example, by 2-adjacent bit error and 3-adjacent bit error, it is generally meant that both or all three, as applicable, adjacent bits are in error. With respect to adjacent bit errors, a KR-Matrix for an N bit word may be used to detect and correct an M adjacent bit error for any value of M greater than or equal to 2. However, for M greater than 2, more than 8 parity bits would be used in accordance with the description herein.

For the modes of operation, there are several conditions used to provide a KR-Matrix 300. At 1501, a single bit error syndrome is provided. Such single bit error syndrome may have a property of uniqueness with respect to detection of single bit errors. Such syndrome corresponding to each 1-bit error may also have a property of uniqueness for each M adjacent bit error for M greater than or equal to 2.

At 1502, an overall parity bit to distinguish between an odd and even number of bits in error is provided. In the example, P8 is an overall parity bit that is concatenated to the other bits for a 73 bit block.

At 1503, a condition is satisfied that events of a single bit in error and M adjacent bits in error are mutually exclusive. More generally, all possible combinations of single and M adjacent error events are mutually exclusive with respect to each other.

At 1504, five bit-error syndrome conditions for M even may be satisfied as follows, where M is even for M=2x for x a positive integer. For M even, a 1-bit error syndrome condition, a 3 adjacent bit error syndrome condition, a (2x−3) adjacent bit error syndrome condition, and a (2x−1) adjacent bit error syndrome condition should each satisfy the following properties: share a common space with a 2 adjacent bit error syndrome, a 4 adjacent bit error syndrome, a (2x−2) adjacent bit error syndrome, and a (2x) adjacent bit error syndrome. With respect to the last of these properties, as there is one extra parity bit to distinguish between odd and even numbers of bits in error, such (2x) adjacent bit error syndrome may be satisfied. Such relationships may be mathematically expressed as:

(2 adjacent bit error syndrome)∩(1 bit error syndrome)==NOT A NULLSET (2 adjacent bit error syndrome)∩(3 adjacent bit error syndrome)==NOT A NULLSET (2 adjacent bit error syndrome)∩(5 adjacent bit error syndrome)==NOT A NULLSET (2 adjacent bit error syndrome)∩(7 adjacent bit error syndrome)==NOT A NULLSET

...

(4 adjacent bit error syndrome)∩(1 bit error syndrome)==NOT A NULLSET (4 adjacent bit error syndrome)∩(3 adjacent bit error syndrome)==NOT A NULLSET (4 adjacent bit error syndrome)∩(5 adjacent bit error syndrome)==NOT A NULLSET (4 adjacent bit error syndrome)∩(7 adjacent bit error syndrome)==NOT A NULLSET

...

($2x$ adjacent bit error syndrome)∩(1 bit error syndrome)==NOT A NULLSET ($2x$ adjacent bit error syndrome)∩(3 adjacent bit error syndrome)==NOT A NULLSET ($2x$ adjacent bit error syndrome)∩(5 adjacent bit error syndrome)==NOT A NULLSET ($2x$ adjacent bit error syndrome)∩(7 adjacent bit error syndrome)==NOT A NULLSET For M even, a 2 adjacent bit error syndrome condition should satisfy a property that it does not share a common space with any of: a 4 adjacent bit error syndrome, a 6 adjacent bit error syndrome, a ($2x-2$) adjacent bit error syndrome, or a ($2x$) adjacent bit error syndrome, namely:

(2 adjacent bit error syndrome)∩(4 adjacent bit error syndrome)∩(6 adjacent bit error syndrome)∩($2x-2$ adjacent bit error syndrome)∩($2x$ adjacent bit error syndrome)==NULLSET At 1505, five conditions for M odd may be satisfied as follows, where M is odd for M=$2x+1$ for x a positive integer. For M odd, a 2 adjacent bit error syndrome condition, a 4 adjacent bit error syndrome condition, a ($2x-2$) adjacent bit error syndrome condition, and a ($2x$) adjacent bit error syndrome condition should each satisfy the following properties: share a common space with a 1 bit error syndrome, a 3 adjacent bit error syndrome, a ($2x-1$) adjacent bit error syndrome, and a ($2x+1$) adjacent bit error syndrome. With respect to the last of these properties, as there is one extra parity bit to distinguish between odd and even numbers of bits, such ($2x$) adjacent bit error syndrome may be satisfied. Such relationships may be mathematically expressed as:

(1 bit error syndrome)∩(2 adjacent bit error syndrome)==NOT A NULLSET (1 bit error syndrome)∩(4 adjacent bit error syndrome)==NOT A NULLSET (1 bit error syndrome)∩(6 adjacent bit error syndrome)==NOT A NULLSET

...

(3 adjacent bit error syndrome)∩(2 adjacent bit error syndrome)==NOT A NULLSET (3 adjacent bit error syndrome)∩(4 adjacent bit error syndrome)==NOT A NULLSET (3 adjacent bit error syndrome)∩(6 adjacent bit error syndrome)==NOT A NULLSET

...

($2x+1$ adjacent bit error syndrome)∩(2 adjacent bit error syndrome)==NOT A NULLSET ($2x+1$ adjacent bit error syndrome)∩(4 adjacent bit error syndrome)==NOT A NULLSET ($2x+1$ adjacent bit error syndrome)∩(6 adjacent bit error syndrome)==NOT A NULLSET For M odd, a 1 bit error syndrome condition, a 3 adjacent bit error syndrome condition, a 5 adjacent bit error syndrome condition, a ($2x-1$) adjacent bit error syndrome condition, and a ($2x+1$) adjacent bit error syndrome condition should satisfy a property that they do not share a common space, namely:

(1 bit error syndrome)∩(3 adjacent bit error syndrome)∩(5 adjacent bit error syndrome)∩($2x-3$ adjacent bit error syndrome)∩($2x-1$ adjacent bit error syndrome)==NULLSET For purposes of clarity and not limitation, continuing an example of an FPGA implementation using BRAM, a 4-to-1 column multiplexing may be used in such BRAM, which may be used in correcting four consecutive bits in error in four different words in four clock cycles. In this example, a word is 16 bits long. However, in other embodiments, other configurations of column multiplexing and/or word length may be used.

With the above exemplary embodiment in mind, suppose for example, an SEU event upsets more than 4 consecutive memory bit cells and less than 9 consecutive memory bit cells. A single SEU causing damages to 5 consecutive memory bit cells and less than 9 consecutive memory bit cells creates a scenario where there could be minimum of 1 set of 2 adjacent bits in error and maximum of 4 sets of 2 adjacent bits in error. The exemplary embodiment of KR-Matrix 300 of FIG. 3 can detect and correct a maximum of 4 sets of 2 adjacent bits in error in 4 clock cycles.

Now, suppose an SEU upsets more than 8 consecutive memory bit cells and less than 13 consecutive memory bit cells. A single SEU causing damages to 9 consecutive memory bit cells and less than 13 consecutive memory bit cells creates a scenario where there could be minimum of 1 set of 3 adjacent bits in error or 4 sets of 3 adjacent bits in error. The exemplary embodiment of KR-Matrix 300 of FIG. 3 can detect and correct a maximum of 4 sets of 3 adjacent bits in error in 4 clock cycles.

Figure 16:
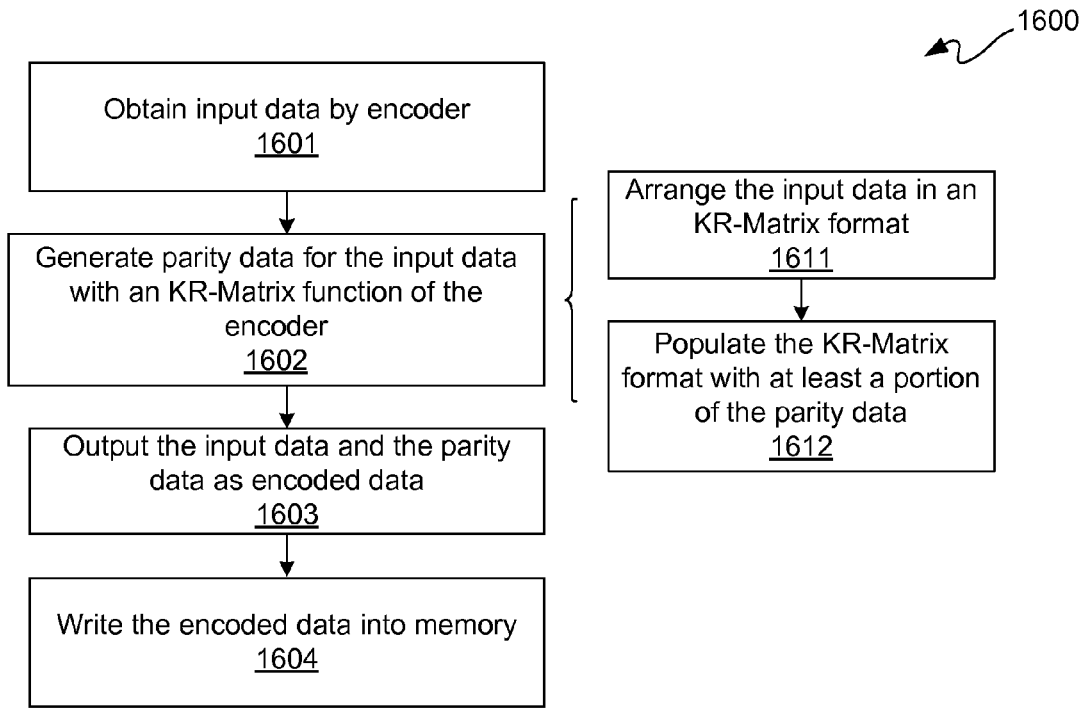
FIG. 16 is a flow diagram depicting an exemplary embodiment of an encoding flow.
Figure 18:
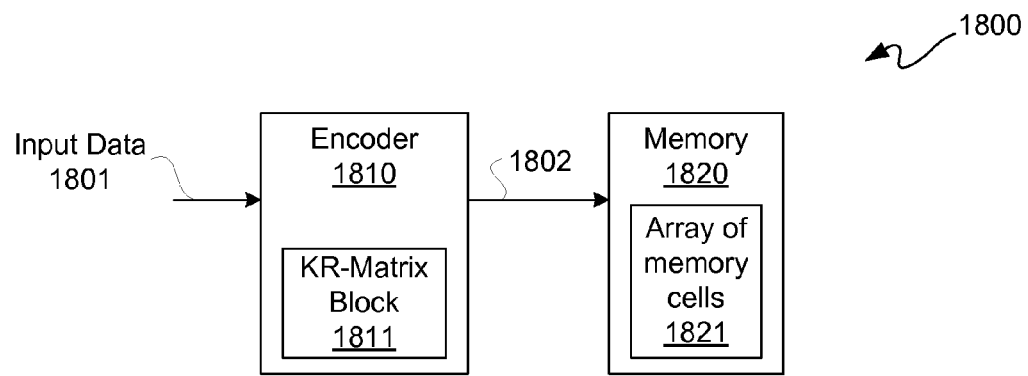
FIG. 18 is a block diagram depicting an exemplary embodiment of an encoding system.

FIG. 16 is a flow diagram depicting an exemplary embodiment of an encoding flow 1600. FIG. 18 is a block diagram depicting an exemplary embodiment of an encoding system 1800. With simultaneous reference to FIGS. 16 and 18, encoding flow 1600 and encoding system 1800 are further described.

At 1601, an encoder 1810 obtains input data 1801. Continuing the above example for purposes of clarity by way of example and not limitation, input data may be the above example of 64-bit input data, namely data bits a0[15:0], a1[15:0], b0[15:0], and b1[15:0].

At 1602, a KR-Matrix function or block 1811 of encoder 1810 takes such data input obtained at 1601 and generates parity bits, such as parity bits P0 through P8 for example. At 1603, such input data and parity data is output as encoded data 1802. Encoded data 1802 may be written to memory 1820 at 1604. Memory 1820 may have an array of memory cells 1821, such as an array of bit cells for example, for storing data and parity bits.

With respect to 1602, input data 1801 is arranged in a KR-Matrix format, as previously described herein, at 1611. At 1612, such KR-Matrix format may be populated with the parity data generated at 1602, such as parity bits P0 through P7 for example. An "overall" parity bit, such as parity bit P8 for example, may be stored in association with other parity bits, such as parity bits P0 through P7 for example, and associated input data 1801. Thus, continuing the above example, input in parity data may be stored in 73 bit blocks.

Figure 17:
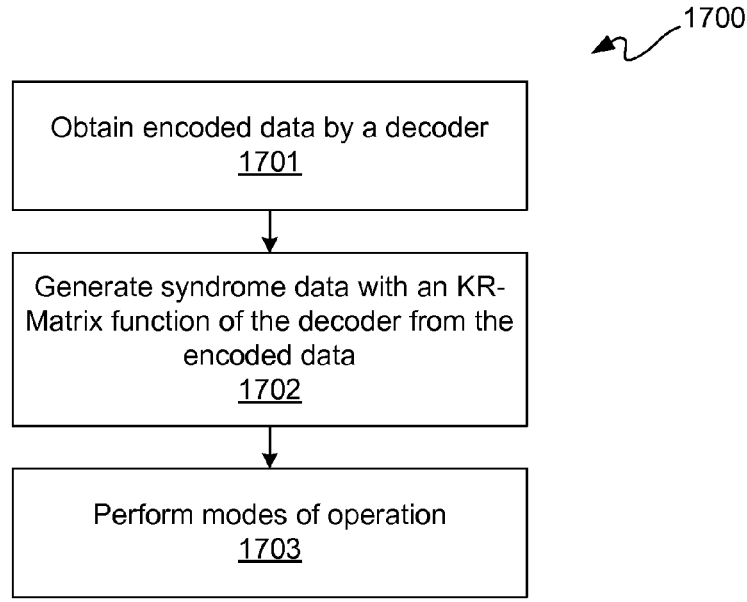
FIG. 17 is a flow diagram depicting an exemplary embodiment of a decoding flow.
Figure 19:
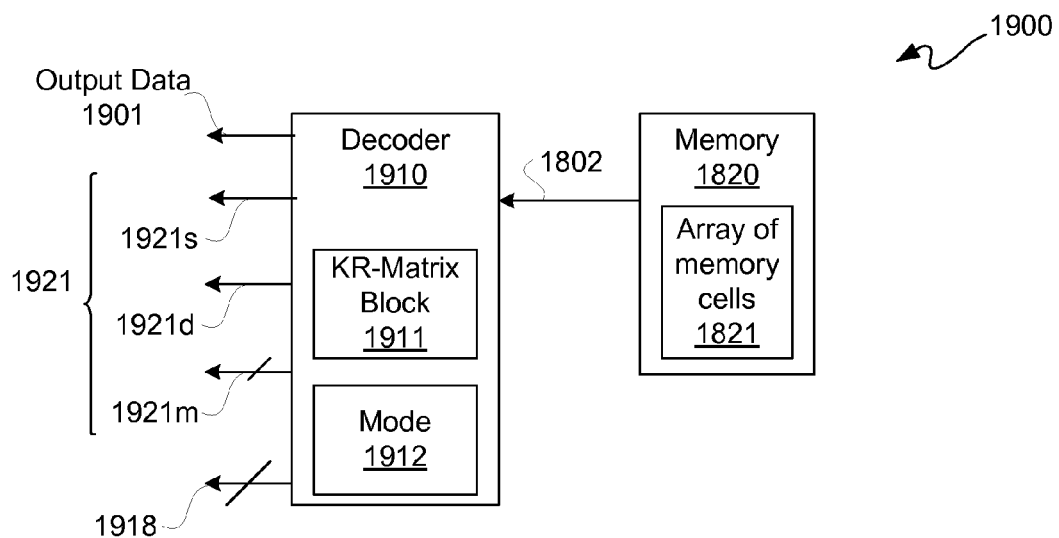
FIG. 19 is a block diagram depicting an exemplary embodiment of a decoding system.

FIG. 17 is a flow diagram depicting an exemplary embodiment of a decoding flow 1700. FIG. 19 is a block diagram depicting an exemplary embodiment of a decoding system 1900. With simultaneous reference to FIGS. 17 and 19, decoding flow 1700 and decoding system 1900 are further described.

At 1701, encoded data 1802 is obtained by a decoder 1910. Encoded data 1802 may be obtained from array of memory cells 1821 of memory 1820. Decoder 1910 may include a KR-Matrix function or block 1911 and a mode block 1912. Continuing the above example for purposes of clarity by way of example and not limitation, encoded data 1802 may be the above example of 64-bit input data, namely data bits a0[15:0], a1[15:0], b0[15:0], and b1[15:0], combined with parity bits P0 through P8. Along those lines, 73 bits of input and parity data may be read from memory 1820.

At 1702, a KR-Matrix block 1811 of decoder 1910 takes such encoded data 1802 input obtained at 1701 and generates syndrome bits 1920, such as syndrome bits S0 through S8 for example. Optionally, syndrome bits 1920 may be output from decoder 1910.

At 1703, modes of operation of mode block 1912 may be performed using status of syndrome bits from memory 1820. Along those lines, modes of operation of mode block 1912 may include: no error detection, detection and correction of single bit errors, detection of double bit errors, and detection and correction of M adjacent bit errors. In order to cover all the above modes for up to 3 adjacent bits in error, at least 9-bit parity is used. Error status signals 1921 along with decoded output data 1901 may be output from decoder 1910. Decoded output data 1901 may include both input data and parity data.

For a no error detection mode, status of all generated syndrome bits 1920, such as syndrome bits S0 through S8 for example, output from decoder 1910 may be zero. Syndrome bits S0 through S7 may be used to determine position of M adjacent bits in error; however, it may not be possible to verify that no other two or more adjacent bits are in error, and as such identification of an error may be provided along with output of corrupted data 1901. Thus, status signals 1921 may be used to provide single bit error status associated with a single bit error space, double nonadjacent bit error status associated with a double nonadjacent bit error space, and M adjacent bit error status associated with an M adjacent bit error space.

Error status signals 1921 may be composed of a single bit error signal 1921s, a double bit error signal 1921d, and a multiple adjacent bit error signal 1921m. Single bit error signal 1921s may be asserted, which in this example is logic high, when a single bit error is detected. Double bit error signal 1921d may be asserted, which in this example is logic high, when two single bit errors are detected and such single bit errors are nonadjacent. Multiple adjacent bit error signal 1921m may be asserted, which is this example is logic high, when two or more multiple adjacent bits in error are detected. Continuing the above example of 9-bit parity for up to 3-tuple adjacent bit errors detected and corrected, there may be a 2-tuple adjacent bit error signal and a 3-tuple adjacent bit error signal, which are generally represented as multiple adjacent bit error signal 1921m. Accordingly, if a 2-tuple or 3-tuple adjacent bit error is detected, multiple adjacent bit error signal 1921m is asserted.

For a single bit error detection and correction mode, any one of the data or parity bits may have been flipped. For this example, such 72 bits are ordered in accordance with a KR-Matrix 300 format, and a $73^{rd}$ bit is concatenated thereto for overall parity. For the above example, this means that anyone of 73 bits may be flipped. Status of single bit error signal 1921s may be logic high, and status of double bit error signal 1921d and status of M adjacent bit error signal 1921m may both be logic low. Syndrome bits S0 through S7 may be used to determine position of a bit in error, and such identified bit in error may be flipped to correct output data 1901.

For an M adjacent bit error detection and correction mode, any two or more adjacent data and/or parity bits may have been flipped. For the above example, this means that two or more adjacent bits of 73 bits may be flipped. Again, for this example, such 72 bits are ordered in accordance with a KR-Matrix 300 format with a $73^{rd}$ bit concatenated thereto as an overall parity bit P8. Status of single bit error signal 1921s may be logic low. Status of double bit error signal 1921d may be logic low. Status of M adjacent bit error signal 1921s may be logic high. Syndrome bits S0 through S7 may be used to determine position of M adjacent bits in error, and such identified bits in error may be flipped to correct output data 1901.

For a double bit error detection mode, any two nonadjacent data and/or parity bits may have been flipped. For the above example, this means that two nonadjacent bits of 73 bits may be flipped. Again, for this example, such 72 bits are ordered in accordance with a KR-Matrix 300 format with an overall parity bit P8 concatenated as a $73^{rd}$ bit. Status of single bit error signal 1921s may be logic low. Status of double bit error signal 1921d may be logic high. Status of M adjacent bit error signal 1921t may be logic low. Syndrome bits S0 through S7 may not be used to determine position of double nonadjacent bits in error.

In order to more fully appreciate, some examples using actual data are provided. FIG. 20 is a flow diagram depicting an example of encoding using KR-Matrix 300 of FIG. 3. FIGS. 21 through 23 are respective flow diagrams depicting examples of decoding using KR-Matrix 300 of FIG. 3 for the encoding example of FIG. 20. Of course, these examples of bits or other bits may be used, and these or other errors may occur.

With reference to FIG. 20, an encoding flow 2000 is described. At 2001, 64-bit hex data is input. At 2002, the hex data at 2001 is converted to binary data 2002. At 2003, 9-bit parity data is generated for the binary data of 2002. The 9-bit parity data and the 64-bit binary data of 2002 is combined in a KR-Matrix format as previously described herein to provide 73-bit data. Such 73-bit data may be encoded in hex, as indicated at 2004, or may be encoded in binary, as indicated at 2005.

With reference to FIG. 21, a decoding flow 2100 for the encoding example of FIG. 20 is described for an error injected into a first bit position a0[0] of the encoded hex data at 2004. This error is injected by an XOR operation at 2101. This error may occur at any bit location due for example to an SEU or other bit upset event. The injection of this error is to illustrate how an error in data may be detected and corrected for a single bit error.

Encoded hex data with an error in a first bit position is indicated at 2102. At 2103, syndrome error data is generated for syndrome bits S[8:0]. This is a syndrome of encoded hex data of 2102, namely hex data 2004 with an error in the first bit position. In this example, the syndrome space is 5, and the S8 bit is equal to 1, which implies that a single bit is in error. This syndrome is unique for bit a0[0] being in error, where the syndrome space for a0[0] is 5. As syndrome bit S8 equals 1, this means a single bit error has occurred. At 2104, the bit at position a0[0] is flipped. At 2105, corrected decoded data is indicated for output. Such corrected data is the same as data input at 2001.

With reference to FIG. 22, a decoding flow 2200 for the encoding example of FIG. 20 is described for an error injected into a first bit position a0[0] and a second bit position a0[1] of the encoded hex data at 2004. This error is injected by an XOR operation at 2211. This error may occur at any two adjacent bit locations due for example to an SEU or other bit upset event. The injection of this error is to illustrate how an error in data may be detected and corrected for a double adjacent bit error.

Encoded hex data with an error in a first bit position and a second bit position is indicated at 2212. At 2213, syndrome error data is generated for syndrome bits S[8:0]. This is a syndrome of encoded hex data of 2212, namely hex data 2004 with an error in the first and second bit positions. In this example, the syndrome space is 15, and the S8 bit is equal to 0. As syndrome bit S8 equals 0, this implies a 2-tuple adjacent bit error has occurred. This syndrome is unique for adjacent bits a0[0] and a0[1] being in error, where the syndrome space for a0[0] is 5, and where the syndrome space for a0[1] is 10. In other words, adjacent data a0[0] and a0[1] has a syndrome 15. At 2214, the bits at positions a0[0] and a0[1] are each flipped. At 2215, corrected decoded data is indicated or output. Such corrected data is the same as data input at 2001.

With reference to FIG. 23, a decoding flow 2300 for the encoding example of FIG. 22 is described for an error injected into a first bit position a0[0], a second bit position a0[1], and a third bit position a0[2] of the encoded hex data at 2004. This error is injected by an XOR operation at 2321. This error may occur at any three adjacent bit locations due for example to an SEU or other bit upset event. The injection of this error is to illustrate how an error in data may be detected and corrected for a triple adjacent bit error.

Encoded hex data with an error in a first bit position, a second bit position, and a third bit position is indicated at 2322. At 2323, syndrome error data is generated for syndrome bits S[8:0]. This is a syndrome of encoded hex data of 2322, namely hex data 2004 with an error in the first, second and third bit positions. In this example, the syndrome space is 30, and the S8 bit is equal to 1. The S8 bit equal to 1 implies an odd number of bits are in error.

Syndrome space for a0[0] is 5; syndrome space for a0[1] is 10; and syndrome space a0[2] is 17. Accordingly, adjacent data a0[0], a0[1], a0[2] has a syndrome of 30. This syndrome is unique for adjacent bits a0[0], a0[1], and a0[2] being in error, and this syndrome does mean that adjacent bits a0[0], a0[1], and a0[2] are uniquely in error, as there is no other 3-tuple adjacent bit error in combination having a syndrome space equal to 30. In other words, this indicates that a 3-tuple adjacent bit error has occurred, and the bit locations are uniquely known. Thus, at 2324, the bits at positions a0[0], a0[1], and a0[2] are each flipped. At 2325, corrected decoded data is indicated or output. Such corrected data is the same as data input at 2001.

Figure 24:
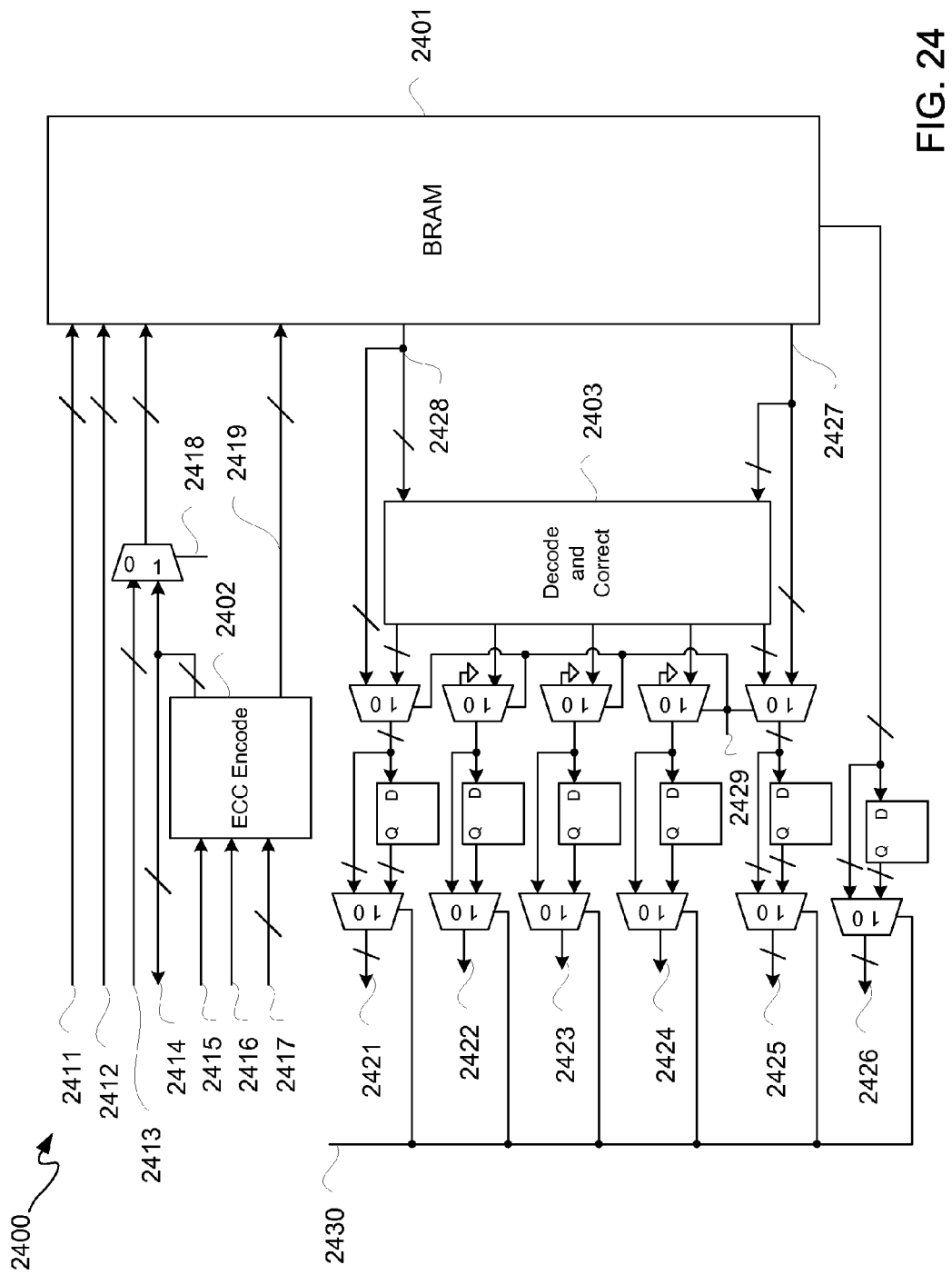
FIG. 24 is a block/circuit diagram depicting an exemplary embodiment of an encoder/decoder ("CODEC") system.

FIG. 24 is a block/circuit diagram depicting an exemplary embodiment of an encoder/decoder ("CODEC") 2400. CODEC 2400 includes BRAM 2401, ECC encoder 2402, and decoder and corrector 2403. Inputs to ECC encoder 2402 include an inject single bit error signal 2415, inject double bit error signal 2416, and a data input signal 2417. ECC encoder 2402 is configured with a KR-Matrix function. Outputs from ECC encoder 2402 include a data input signal 2419 for BRAM 2401 and an ECC parity signal 2414, which is a multiplexed input to BRAM 2401 for a logic 1 state of an enable ECC write signal 2418. Another input to such multiplexer is a data input parity signal 2413, which is a multiplexed input to BRAM 2401 for a logic 0 state of an enable ECC write signal 2418. Other signals provided to BRAM 2401 include a write address signal 2411 and a read address signal 2412.

From BRAM 2401 are provided a data out signal 2428, a parity out signal 2427, and a data address ECC signal 2426. Data address ECC signal 2426 is a multiplexed output, which is a registered output for data output register select signal 2430 being a logic high and a non-registered output for data output register select signal 2430 being a logic low.

Data out signal 2428 and parity out signal 2427 are provided to decoder and corrector 2403, and data out signal 2428 and parity out signal 2427 are provided to respective multiplexers to bypass decoder and corrector 2403. A bypass mode is used when enable ECC read signal 2429 is logic low; however, when enable ECC read signal 2429 is logic high, data, parity, and syndrome bits, output from decoder and corrector 2403, are used. Thus, data output signal 2421 and parity output 2427 may be provided either through decoder and corrector 2403 or more directly from BRAM 2401. Syndrome bit output signals from decoder and corrector 2403 include double adjacent bit error signal 2422, single bit error signal 2423, and triple adjacent bit error signal 2424. Additionally, a double nonadjacent bit error signal may be output from decoder and corrector 2403, though not shown here. It should be understood that more adjacent bit error signals may be output from decoder and corrector 2403, for detection and correction of more than three adjacent bits in error. Thus, for example, to detect and correct four adjacent bits in error, a four bit error signal would be output from decoder and corrector 2403, and to detect and correct five adjacent bits in error, a five bit error signal would be output from decoder and corrector 2403, and so on.

Data output parity 2425 may be parity out signal 2427 when decoder and corrector 2403 is bypassed, and thus parity bits of such parity out signal 2427 may be parity bits from ECC parity signal 2414 or data input parity 2413. However, when decoder and corrector 2403 is not bypassed, data output parity 2425 is syndrome bits output from decoder and corrector 2403. Such syndrome bits may be determined from data output 2428 and parity bits from either ECC parity signal 2414 or data input parity 2413. Such syndrome bits may be used to identify which bits are in error for use in response to a bit error signal being active high for example.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
   an encoder to receive input data;
   wherein the encoder has a first Kumar Rahul Code matrix ("KR-Matrix") block to provide a first block code matrix function;
   wherein data bits and parity bits of the first KR-Matrix are for writing to and reading from memory cells of a memory array;

wherein the first KR-Matrix block is configured to:
exclusively OR (n−1) different combinations of subsets of the data bits of the input data to generate (n−I) parity bits of the parity bits for n a positive integer greater than zero; and
exclusively OR a combination of all of the data bits and all the (n−1) parity bits to generate an (n) parity bit of the parity bits; and
provide encoded data by arrangement of the data bits and the (n−1) parity bits in a KR-Matrix format;
wherein:
the KR-Matrix format includes twice a number of rows with a same number of columns with respect to a Hamming Code configuration of the input data and the parity data; and
the KR-Matrix format has approximately 1-to-1 ratio of occupied cells to unoccupied cells of the memory cells.

2. The apparatus according to claim 1, further comprising:
a decoder having a second Kumar Rahul Code matrix ("KR-Matrix") block to provide a second block code matrix function;
wherein the second KR-Matrix block is configured to:
exclusively OR the (n−1) different combinations of the subsets of the data bits respectively with an associated parity bit of the (n−1) parity bits to generate (n−1) syndrome bits; and
exclusively OR the combination of all of the data bits and all the (n) parity bits to generate an (n) syndrome bit.

3. The apparatus according to claim 2, wherein the decoder is configured to:
detect no bit in error;
detect and correct a single bit error;
detect a double bit error;
detect and correct a double adjacent bit error; and
detect and correct a triple adjacent bit error.

4. The apparatus according to claim 2, wherein the decoder is configured to:
detect no bit in error;
detect and correct a single bit error;
detect a double bit error;
detect and correct a double adjacent bit error; and
detect and correct an M adjacent bit error for M equal to or greater than 3.

5. The apparatus according to claim 2, wherein the decoder is configured to provide a single bit error status, a double adjacent bit error status, and a triple adjacent bit error status.

6. An encoder, comprising:
a Kumar Rahul Code matrix ("KR-Matrix") block configured to generate parity data from input data with exclusive ORs;
wherein data bits and parity bits of the KR-Matrix are for writing to and reading from memory cells of a memory array;
wherein the exclusive ORs are of:
(n−1) different combinations of subsets of the data bits of the input data to generate (n−1) parity bits of the parity bits for n a positive integer greater than zero; and
a combination of all of the data bits and all the (n−1) parity bits to generate an (n) parity bit of the parity bits;
wherein the KR-Matrix block is further configured to:
arrange the input data as associated with a matrix format having approximately a 1-to-1 ratio of occupied cells to unoccupied cells of the memory cells;
wherein the matrix format includes doubling a number of rows while maintaining a number of columns with respect to a Hamming Code configuration of the input data and the parity data;
distribute the input data throughout the matrix format in an out-of-sequence order with respect to an input order of the input data; and
populate the matrix format with the parity data generated.

7. The encoder according to claim 6, wherein some of the parity data does not change location with respect to the Hamming Code configuration.

8. The encoder according to claim 7, wherein distribution of the input data throughout the matrix format includes:
sets of data bits of the input data with at least two parity bits of the parity data placed at an end of each of the sets of the data bits to provide sequences of 1-tuple bits;
two adjacent bits of each of the sequences paired to provide 2-tuple bits; and
three adjacent bits of each of the sequences concatenated to provide 3-tuple bits.

9. The encoder according to claim 7, wherein distribution of the input data throughout the matrix format includes:
at least two associated parity bits of the parity data placed in each of a plurality of sets of the input data to provide sequences of singleton bits;
wherein the at least two associated parity bits are respectively placed at an end of the sequences;
two adjacent bits of each of the sequences paired to provide 2-tuple bits; and
three adjacent bits of each of the sequences concatenated to provide 3-tuple bits.

10. An apparatus, comprising:
a memory for storing encoded data;
a decoder coupled to the memory to receive the encoded data;
wherein the decoder comprises a block code matrix function configured to:
generate syndrome information from the encoded data; and
decode the encoded data to provide decoded data;
wherein the block code matrix function of the decoder is further configured to:
detect and correct a double adjacent bit error;
detect and correct a triple adjacent bit error; and
detect and correct an M adjacent bit error for M equal to or greater than 3;
wherein for M even, a 3 adjacent bit error syndrome condition shares a common space with a 2 adjacent bit error syndrome;
wherein:
the block code matrix function is configured to arrange data bits and parity bits of the encoded data to generate the syndrome information;
the data bits and parity bits are for writing to and reading from memory cells of a memory array;
to provide the syndrome information from the encoded data, the block code matrix function includes exclusive OR resources configured to exclusively OR:
(n−1) different combinations of subsets of the data bits and an associated parity bit of the parity bits from a matrix format to generate each bit(n−1) syndrome bit for n a positive integer greater than one; and
a combination of all of the data bits and all of the parity bits from the encoded data to generate a bit(n) syndrome bit; and the matrix format includes double a number of rows with a same number of columns with respect to a Hamming Code configuration of the data bits and the parity bits; and wherein the matrix format has approximately a 1-to-1 ratio of occupied cells to unoccupied cells of the memory cells.

11. The apparatus according to claim 10, wherein the block code matrix function is further configured to:

detect no bit in error;

detect and correct a single bit error; and detect a double bit error.

12. The apparatus according to claim 11, wherein the decoder is configured to provide a single bit error status, a double adjacent bit error status, and a triple adjacent bit error status.

13. The apparatus according to claim 10, wherein the arrangement of the encoded data includes:

sets of the data bits with at least two parity bits of the parity bits placed at an end to provide sequences of singleton bits;

two adjacent bits of each of the sequences paired to provide 2-tuple bits; and three adjacent bits of each of the sequences concatenated to provide 3-tuple bits.

14. The apparatus according to claim 10, wherein the arrangement of the encoded data includes:

two associated parity bits of the parity bits placed in each of a plurality of sets of the data bits to provide sequences of 1-tuple bits;

wherein the two associated parity bits are placed at an end of the data bits to provide the sequences;

two adjacent bits of each of the sequences paired to provide 2-tuple bits; and three adjacent bits of each of the sequences concatenated to provide 3-tuple bits.

\* \* \* \* \*